US009472581B2

(12) United States Patent
Woo et al.

(10) Patent No.: US 9,472,581 B2
(45) Date of Patent: Oct. 18, 2016

(54) DISPLAY DEVICE

(71) Applicant: Samsung Display Co., Ltd., Yongin-si, Gyeonggi-Do (KR)

(72) Inventors: Hwa Sung Woo, Asan-si (KR); Yun Seok Lee, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/689,215

(22) Filed: Apr. 17, 2015

(65) Prior Publication Data

US 2016/0104722 A1 Apr. 14, 2016

(30) Foreign Application Priority Data

Oct. 10, 2014 (KR) ........................ 10-2014-0136994

(51) Int. Cl.
*H01L 27/14* (2006.01)
*H01L 27/12* (2006.01)
*G02F 1/1368* (2006.01)

(52) U.S. Cl.
CPC ........... *H01L 27/124* (2013.01); *G02F 1/1368* (2013.01)

(58) Field of Classification Search
CPC ........................ H01L 27/124; G02F 1/1368
USPC ......................................................... 257/72
See application file for complete search history.

(56) References Cited

U.S. PATENT DOCUMENTS

| 2009/0256985 | A1* | 10/2009 | Jung | ..................... G02F 1/1368 349/48 |
| 2012/0168058 | A1* | 7/2012 | Kim | ................... B29D 11/0073 156/101 |
| 2013/0083263 | A1* | 4/2013 | Kim | .................. G02F 1/134336 349/38 |
| 2013/0088667 | A1* | 4/2013 | Kong | ................ G02F 1/133528 349/96 |
| 2015/0168794 | A1* | 6/2015 | Park | ..................... G09G 3/3659 349/48 |

FOREIGN PATENT DOCUMENTS

| KR | 10-2011-0046125 A | 5/2011 |
| KR | 10-2013-0125638 A | 11/2013 |

\* cited by examiner

*Primary Examiner* — Douglas Menz
(74) *Attorney, Agent, or Firm* — Robert E. Bushnell, Esq.

(57) ABSTRACT

A display device according to an exemplary embodiment of the present invention includes: a first insulation substrate; a thin film transistor disposed on the first insulation substrate; a pixel electrode coupled to the thin film transistor; a second insulation substrate facing the first insulation substrate; and a common electrode disposed on the second insulation substrate. The pixel electrode includes a first subpixel electrode that includes a first horizontal stem portion by which two different regions where arrangements of liquid crystal molecules are respectively different are divided, and a second subpixel electrode that includes a second horizontal stem portion by which two regions where the arrangements of the liquid crystal molecules are respectively different are divided and a cross-shaped stem portion by which four regions where the arrangements of the liquid crystal molecules are respectively different are divided.

18 Claims, 15 Drawing Sheets

DISPLAY DEVICE

CLAIM PRIORITY

This application makes reference to, incorporates the same herein, and claims all benefits accruing under 35 U.S.C. §119 from an application earlier filed in the Korean Intellectual Property Office on 10 Oct. 2014 and there duly assigned Serial No. 10-2014-0136994.

BACKGROUND OF THE INVENTION

1. Field of Invention

The present invention relates to a display device.

2. Description of the Related Art

In general, as one of the most widely used displays at present, a liquid crystal display (LCD) include two display panels on which field generating electrodes such as a pixel electrode and a common electrode are formed, and a liquid crystal layer interposed between the two display panels.

The LCD displays an image by generating an electric field on a liquid crystal layer by applying a voltage to the field generating electrodes, determining alignment directions of liquid crystal molecules of the liquid crystal layer through the generated field, and controlling polarization of incident light.

The size of the LCD is becoming larger since it is used as a display of a television receiver.

As such, as the size of the LCD becomes larger, a significant visual difference is observed by a viewer depending on whether a center portion or left/right ends of a screen is viewed.

To compensate such a visual difference therebetween, the display device can be concavely or convexly curved, thereby forming a curved display.

Based on the viewer, the display device may be a portrait type of display device with its vertical length longer than its horizontal length that is curved in a vertical direction, or a landscape type of display device with its vertical length shorter than its horizontal length that is curved in a horizontal direction.

However, when the LCD is curvedly formed, a shearing stress is applied, in particular, to a substrate that is disposed at an inner side of a curved portion, and problems such as texture generation, decreased luminance, etc. caused by misalignment of upper and lower substrates occur.

The above information disclosed in this Related Art section is only for enhancement of understanding of the background of the invention and therefore it may contain information that does not form the prior art that is already known in this country to a person of ordinary skill in the art.

SUMMARY OF THE INVENTION

The present invention has been made in an effort to improve display abnormality and decreased luminance generated in a display device by changing shapes and arrangements of pixel electrodes, and in particular, to provide a curved display device with improved quality.

An exemplary embodiment of the present invention provides a display device including: a first insulation substrate; a thin film transistor disposed on the first insulation substrate; a pixel electrode coupled to the thin film transistor; a second insulation substrate facing the first insulation substrate; and a common electrode disposed on the second insulation substrate. The pixel electrode includes a first subpixel electrode that includes a first horizontal stem portion by which two different regions where arrangements of liquid crystal molecules are respectively different are divided, and a second subpixel electrode that includes a second horizontal stem portion by which two regions where the arrangements of the liquid crystal molecules are respectively different are divided and a cross-shaped stem portion by which four regions where the arrangements of the liquid crystal molecules are respectively different are divided.

The display device may be a curved type.

The first subpixel electrode and the second subpixel electrode may further include a plurality of micro branch portions that diagonally extend from the first horizontal stem portion, the second horizontal stem portion, and the cross-shaped stem portion, and one pixel area may be a region that overlaps the pixel electrode and in which the liquid crystal molecules are arranged.

The second horizontal stem portion of the one pixel area may be disposed adjacent to the first horizontal stem portion.

The cross-shaped stem portion of the one pixel area may be disposed adjacent to the first horizontal stem portion.

The first subpixel electrode may further include a first vertical stem portion that is disposed at one end of the first horizontal stem portion, the second subpixel electrode may further include a second vertical stem portion that is disposed at one end of the second horizontal stem portion, and the first and second vertical stem portions may be alternately disposed.

Four regions where the arrangements of the liquid crystal molecules are respectively different may be divided by the first and second horizontal stem portions.

An area ratio of the micro branch portions extending from the first horizontal stem portion to the micro branch portions extending from the second horizontal stem portion may be about 1:1.

The first vertical stem portions adjacent to each other in a column direction may be alternately disposed.

The first vertical stem portions adjacent to each other in a row direction may be alternately disposed.

The first and second subpixel electrodes may further include a plurality of micro branch portions that diagonally extend from the first horizontal stem portion, the second horizontal stem portion, and the cross-shaped stem portion, and one pixel area may be a region that overlaps the first and second subpixel electrodes and in which the liquid crystal molecules are arranged.

The second horizontal stem portion of the one pixel area may be disposed adjacent to the first horizontal stem portion.

The cross-shaped stem portion of the one pixel area may be disposed adjacent to the first horizontal stem portion.

The first subpixel electrode may further include a first vertical stem portion that is disposed at one end of the first horizontal stem portion, the second subpixel electrode may further include a second vertical stem portion that is disposed at one end of the second horizontal stem portion, and the first and second vertical stem portions may be alternately disposed.

Four regions where the arrangements of the liquid crystal molecules are respectively different may be divided by the first and second horizontal stem portions.

An area ratio of the micro branch portions extending from the first horizontal stem portion to the micro branch portions extending from the second horizontal stem portion may be about 1:1.

The first vertical stem portions adjacent to each other in a column direction may be alternately disposed.

The first vertical stem portions adjacent to each other in a row direction may be alternately disposed.

According to the display device described above, even if the display device is curved, texture generation caused by the misalignment of the upper and lower substrates can be controlled and improved luminance can be provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
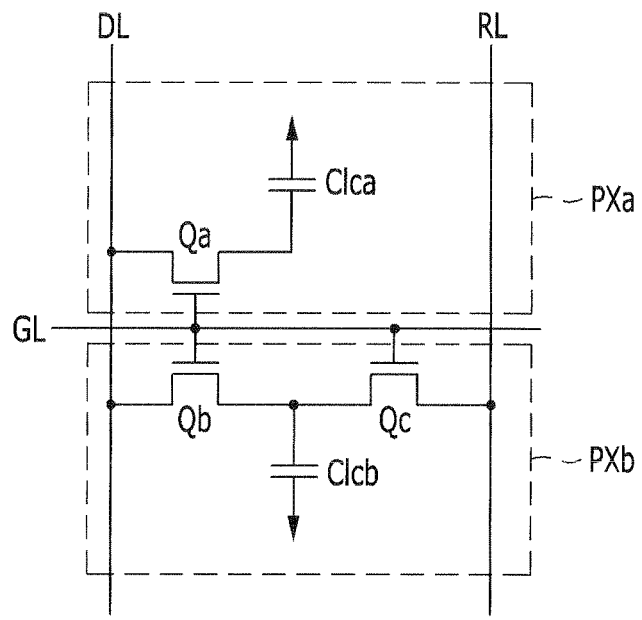
FIG. 1 is a circuit diagram of one pixel according to an exemplary embodiment of the present invention.

The present invention will be described more fully hereinafter with reference to the accompanying drawings, in which exemplary embodiments of the invention are shown. The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
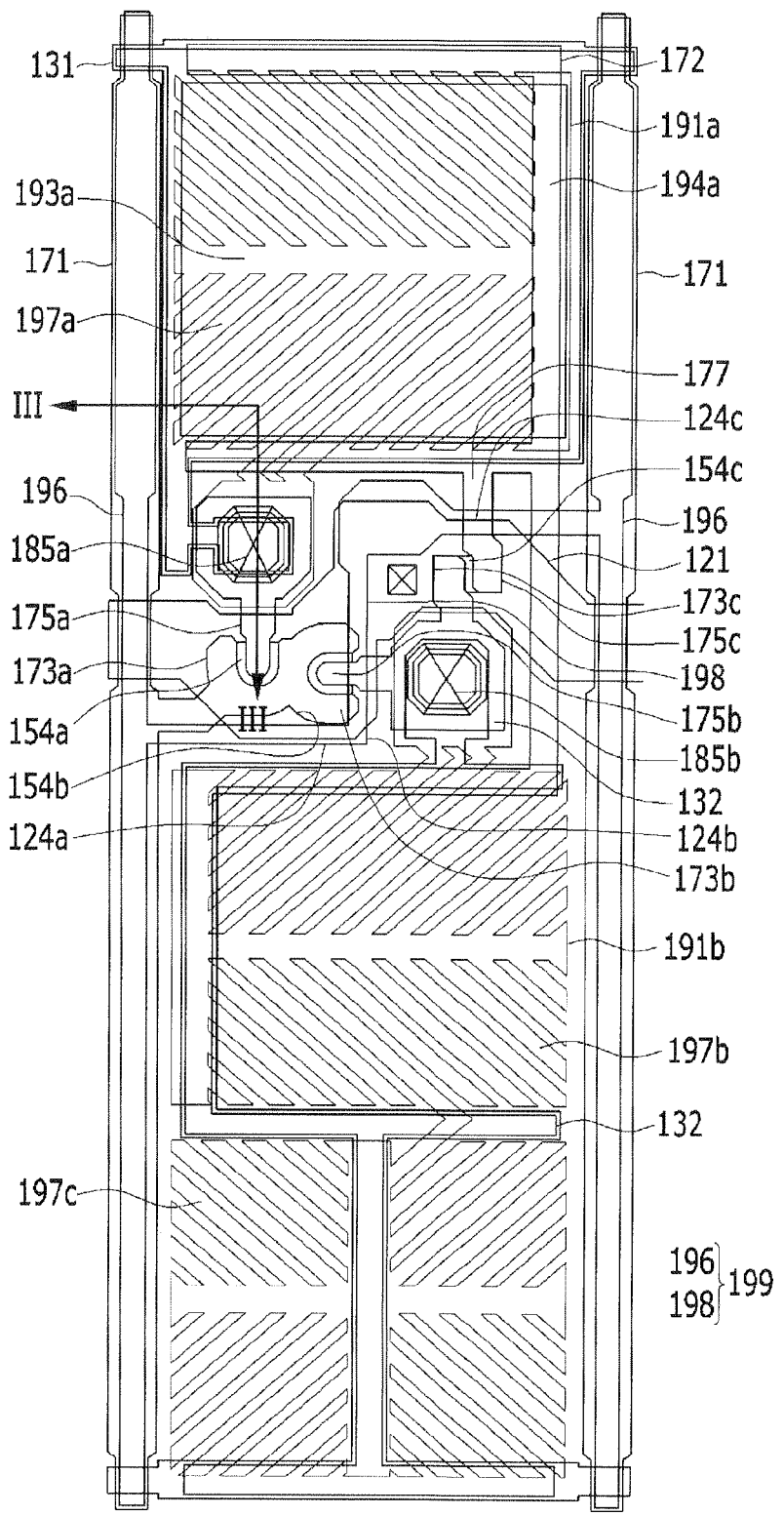
FIG. 2 is a top plan view of one pixel according to the exemplary embodiment of the present invention.
Figure 3:
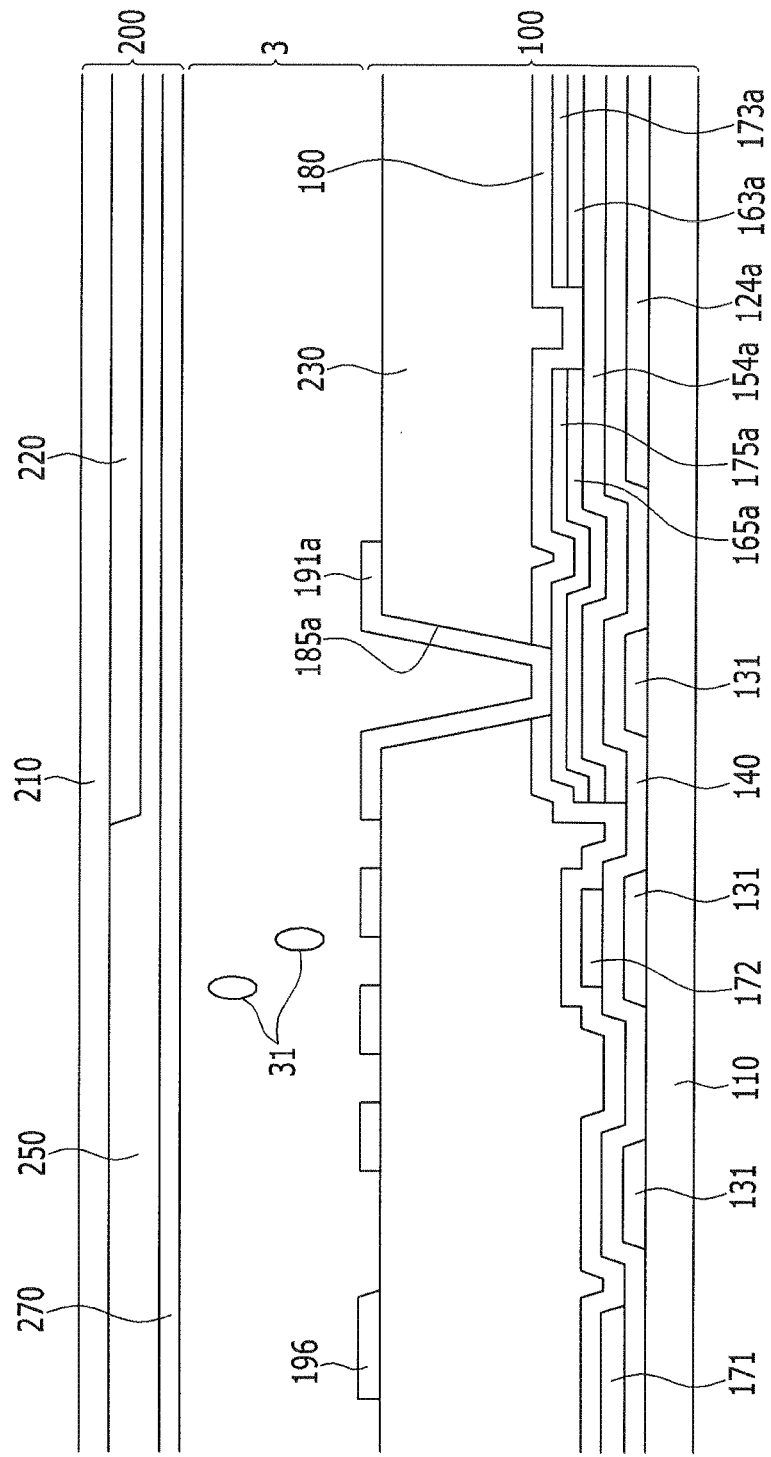
FIG. 3 is a cross-sectional view of FIG. 2 taken along the line III-III.
Figure 4:
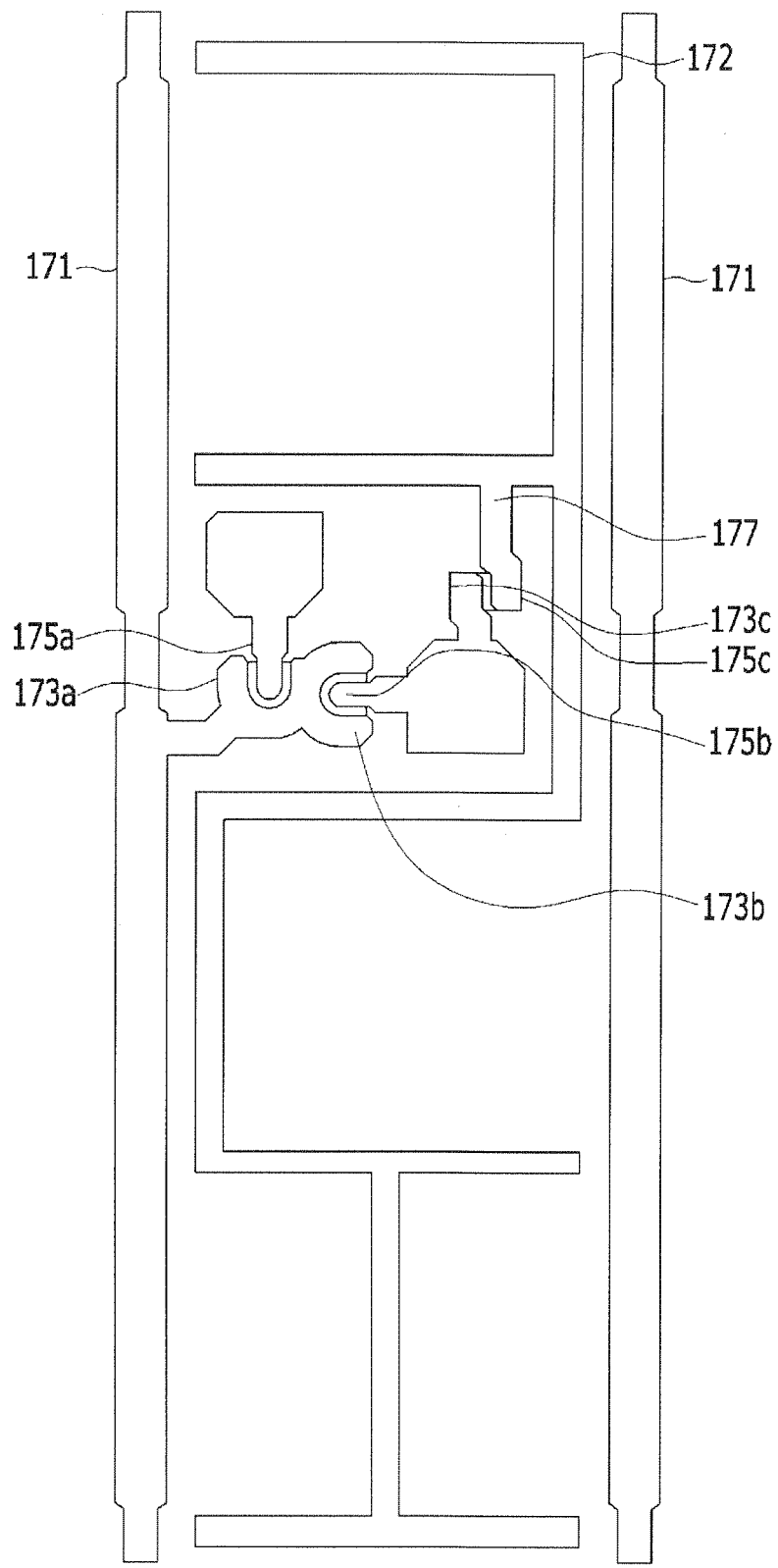
FIG. 4 is a top plan view of a data conductor layer according to the exemplary embodiment of the present invention.
Figure 5:
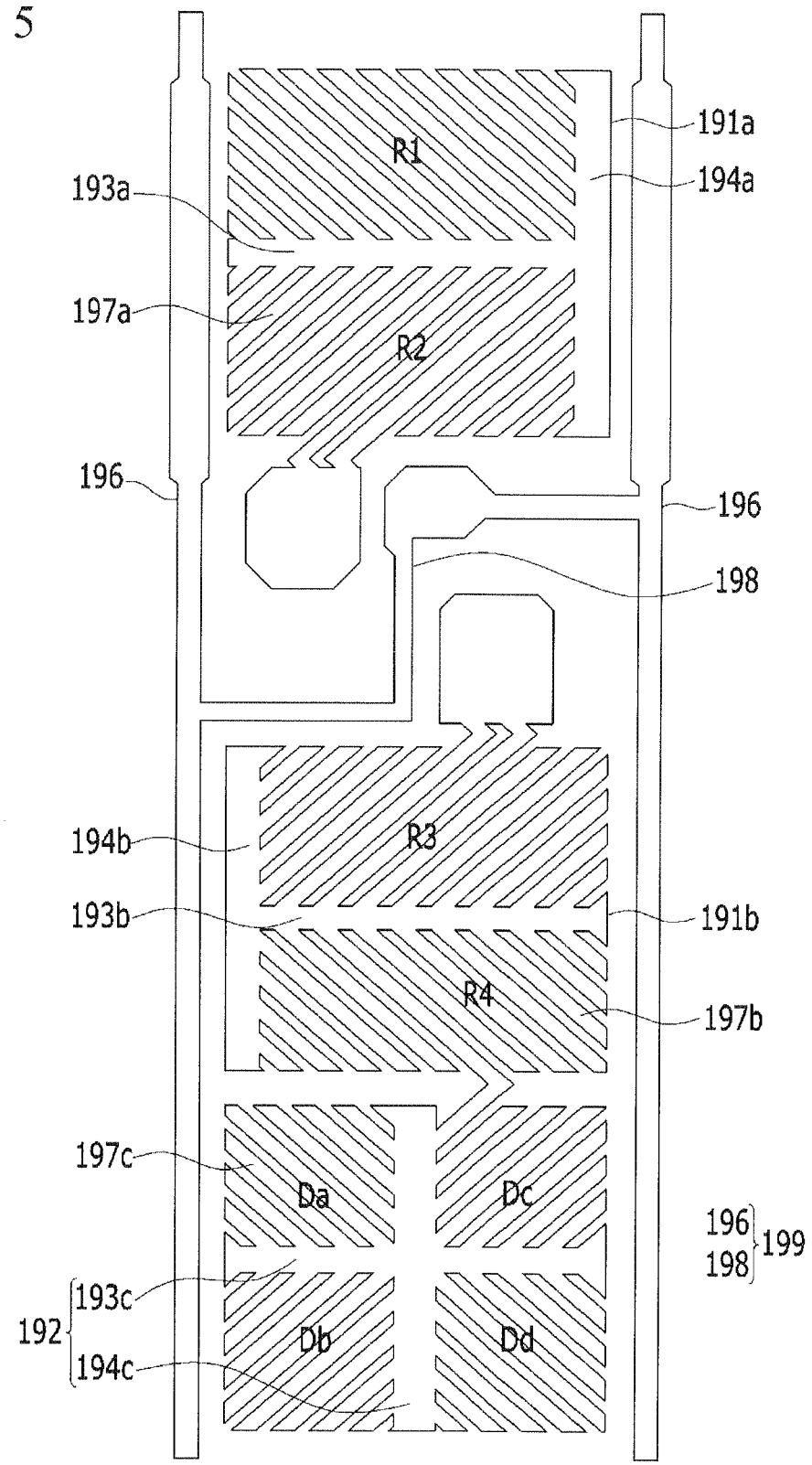
FIG. 5 is a top plan view of a pixel electrode layer according to the exemplary embodiment of the present invention.

FIG. 1 is a circuit diagram of one pixel according to an exemplary embodiment of the present invention, FIG. 2 is a top plan view of one pixel according to the exemplary embodiment of the present invention, FIG. 3 is a cross-sectional view of FIG. 2 taken along the line III-III, FIG. 4 is a top plan view of a data conductor layer according to the exemplary embodiment of the present invention, and FIG. 5 is a top plan view of a pixel electrode layer according to the exemplary embodiment of the present invention.

First, referring to FIG. 1, one pixel PX of a display device according to the present exemplary embodiment includes: a plurality of signal lines including a gate line GL for transmitting a gate signal, a data line DL for transmitting a data signal, and a divided reference voltage line RL for transmitting a divided reference voltage; and first, second, and third switching elements Qa, Qb, and Qc and first and second liquid crystal capacitors Clca and Clcb that are coupled to the plurality of signal lines.

The first and second switching elements Qa and Qb are respectively coupled to the gate line GL and the data line DL, and the third switching element Qc may be coupled to an output terminal of the second switching element Qb and the divided reference voltage line RL.

The first and second switching elements Qa and Qb are three-terminal elements such as a thin film transistor and the like, control terminals thereof are coupled to the gate line GL, input terminals thereof are coupled to the data line DL, an output terminal of the first switching element Qa may be coupled to the first liquid crystal capacitor Clca, and an output terminal of the second switching element Qb may be coupled to the second liquid crystal capacitor Clcb and an input terminal of the third switching element Qc.

The third switching element Qc is also a three-terminal element such as a thin film transistor, a control terminal thereof may be coupled to the gate line GL, the input terminal thereof may be coupled to the second liquid crystal capacitor Clcb, and an output terminal thereof may be coupled to the divided reference voltage line RL.

When a gate-on signal is applied to the gate line GL, the first, second, and third switching elements Qa, Qb, and Qc coupled thereto are turned on.

Accordingly, the data voltage applied to the data line DL is applied to a first subpixel electrode PXa and a second subpixel electrode PXb through the turned-on first and second switching elements Qa and Qb.

In this case, the data voltages applied to the first and second subpixel electrodes PXa and PXb are identical to each other, and the first and second liquid crystal capacitors Clca and Clcb are charged with the same amount of charges corresponding to a difference between a common voltage and the data voltage.

Simultaneously, a voltage charged to the second liquid crystal capacitor Clcb may be divided by the turned-on third switching element Qc.

Thus, the voltage charged to the second liquid crystal capacitor Clcb decreases by a difference between the common voltage and the divided reference voltage.

That is, a voltage charged to the first liquid crystal capacitor Clca is higher than the voltage charged to the second liquid crystal capacitor Clcb.

As such, the voltages charged to the first and second liquid crystal capacitors Clca and Clcb are different from each other.

Since the voltages of the first and second liquid crystal capacitors Clca and Clcb are different from each other, tilt angles of liquid crystal molecules of the first and second subpixels are different, thereby obtaining the two subpixels of different luminances.

Accordingly, when the voltages of the first and second liquid crystal capacitors Clca and Clcb are appropriately adjusted, an image viewed from a front side is as close as possible to an image viewed from a lateral side, thereby improving side visibility.

The third switching element Qc coupled to the second liquid crystal capacitor Clcb and the divided reference voltage line RL may be included in the illustrated exemplary embodiment to make the voltages charged to the first and second liquid crystal capacitors Clca and Clcb different, but in an LCD according to another exemplary embodiment of the present invention, the second liquid crystal capacitor Clcb may be coupled to a step-down capacitor.

Specifically, an amount of charges charged in the second liquid crystal capacitor Clcb, which includes an amount of charges charged in the third switching element including a first terminal coupled to a step-down gate line, a second terminal coupled to the second liquid crystal capacitor Clcb, and a third terminal coupled to the step-down capacitor, is allowed to be partially charged in the step-down capacitor, thereby differently setting the charged voltages between the first and second liquid crystal capacitors Clca and Clcb.

In addition, in the LCD according to another exemplary embodiment of the present invention, the first and second liquid crystal capacitors Clca and Clcb are respectively coupled to different data lines to be applied with different data voltages, thereby differently setting the charged voltages between the first and second liquid crystal capacitors Clca and Clcb.

Alternatively, using various different methods, the charged voltages between the first and second liquid crystal capacitors Clca and Clcb can be differently set.

This will be described later in more detail with reference to FIGS. 12 to 15.

Next, referring to FIGS. 2 and 3, a gate conductor including a gate line 121 and storage electrode lines 131 and 132 may be disposed on a first insulation substrate 110 that may be formed of transparent glass, plastic, or the like.

The gate line 121 includes a wide end portion (not shown) for contacting gate electrodes 124a, 124b, and 124c and other layers or an external driving circuit.

The gate line 121 and the storage electrode lines 131 and 132 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

The gate line 121 may have a multilayer structure in which at least two conductive layers having different physical properties are included.

The gate line 121 traverses a pixel area in a column direction.

Based on the gate line 121, a first subpixel electrode 191a for displaying a high gray may be disposed upward and a second subpixel electrode 191b for displaying a low gray may be disposed downward, and their positions can be interchanged.

The storage electrode lines 131 and 132 may be formed of the same material as the gate line 121, and may be integrally formed with the gate line 121.

The first storage electrode line 131 disposed upward of the gate line 121 may have a quadrangular shape that encloses the first subpixel electrode 191a.

An uppermost side of the first storage electrode line 131 having the quadrangular shape may be horizontally expanded outside of one pixel area such that it may be coupled to other layers or an external driving circuit.

The second storage electrode line 132 disposed downward of the gate line 121 includes a plurality of horizontal portions, and a plurality of vertical portions for interconnecting a plurality of vertical portions at edges of the plurality of horizontal portions.

In the present specification, the storage electrode lines 131 and 132 having the aforementioned shapes are described and illustrated, but they are not limited thereto, and may have any shapes that are required to perform the same functions.

A gate insulating layer 140 may be disposed on the gate conductor.

A first semiconductor layer 154a, a second semiconductor layer 154b, and a third semiconductor layer 154c are disposed on the gate insulating layer 140.

A plurality of ohmic contacts 163a, 165a, 163b, 165b, 163c, and 165c are disposed on the semiconductor layers 154a, 154b, and 154c, and may be omitted if the semiconductor layers 154a, 154b, and 154c are formed of an oxide semiconductor material.

A data line 171 including source electrodes 173a, 173b, and 173c, a data conductor including drain electrodes 175a, 175b, and 175c, and a divided reference voltage line 172 are formed on ohmic contacts 163a, 165a, 163b, 165b, 163c, and 165c and the gate insulating layer 140.

The data conductor, the ohmic contacts, and the semiconductor layers disposed therebelow may be simultaneously formed using one mask.

FIG. 4 is a top plan view of a data conductor layer according to the exemplary embodiment of the present invention.

The data conductor includes the data line 171, the first source electrode 173a, the second source electrode 173b, the third source electrode 173c, the first drain electrode 175a, the second drain electrode 175b, the third drain electrode 175c, and the divided reference voltage line 172.

The data lines 171 extend in a row direction along edges of one pixel area, and include the first and second source electrodes 173a and 173b.

The first and second source electrode 173a and 173b may have a U-shape, but they are not limited thereto.

The first drain electrode 175a faces the first source electrode 173a and has, as an example, an I-shape corresponding to the U-shaped first source electrode 173a, and includes a widely expanded region that is coupled to the first subpixel electrode 191a.

Similarly, the second drain electrode 175b faces the second source electrode 173b, and has, as an example, an I-shape corresponding to the U-shaped second source electrode 173b, and includes a widely expanded region that may be connected to the second subpixel electrode 191b.

The third source electrode 173c may be formed to extend from one side of the second drain electrode 175b.

In addition, the data conductor includes the divided reference voltage line 172, and the divided reference voltage line 172 includes the third source electrode 173c and the third drain electrode 175c that forms the thin film transistor.

Referring to FIG. 4, the divided reference voltage line 172 includes a plurality of horizontal portions and a plurality of vertical portions for interconnecting them.

That is, in the divided reference voltage line 172, the plurality of horizontal portions and the plurality of vertical portions for interconnecting them may be included such that the vertical portions are connected at one ends or in the middle of the horizontal portions that are parallel to each other.

The divided reference voltage line 172 may respectively have different shapes in the first and second subpixel electrodes 191a and 191b.

As shown in FIG. 4, the divided reference voltage line 172 disposed in the first subpixel electrode 191a may include two horizontal portions and one vertical portion, and the divided reference voltage line 172 disposed in the second subpixel electrode 191b may include two horizontal portions and two vertical portions.

One vertical portion may be coupled to one end of each of two horizontal portions, and the other vertical portion may be disposed such that it extends from the middle of one horizontal portion.

These are arranged according to a shape of the pixel electrode 191, and a shape of the divided reference voltage line 172 may also be modified as the shape of pixel electrode 191 may be modified.

Specifically, the divided reference voltage line 172 disposed in the first subpixel electrode 191a partially overlaps ends of a first vertical stem portion 194a and first micro branch portions 197a.

The divided reference voltage line 172 disposed in the second subpixel electrode 191b partially overlaps ends of a second vertical stem portion 194b and second micro branch portions 197b, and may be disposed to overlap a third vertical stem portion 194c of the cross-shaped stem portion.

In the divided reference voltage line 172 disposed in the first subpixel electrode 191a, a horizontal portion 177 may be partially branched downward to be the third drain electrode 175c.

The first gate electrode 124a, the first source electrode 173a, and the first drain electrode 175a that are described above form a first thin film transistor (TFT) Qa along with the first semiconductor layer 154a, and a channel of the TFT may be formed in the first semiconductor layer 154a between the first source electrode 173a and the first drain electrode 175a.

Similarly, the second gate electrode 124b, the second source electrode 173b, and the second drain electrode 175b form a second TFT Qb along with the second semiconductor layer 154b, and a channel of the TFT may be formed in the second semiconductor layer 154b between the second source electrode 173b and the second drain electrode 175b, while the third gate electrode 124c, the third source electrode 173c, and the third drain electrode 175c form a third TFT Qc along with the third semiconductor layer 154c, and a channel of the TFT may be formed in the third semiconductor layer 154c between the third source electrode 173c and the third drain electrode 175c.

A passivation layer 180 may be disposed on the data conductor and the exposed the semiconductor layers 154a, 154b, and 154c.

The passivation layer 180 may be formed of a material such as a silicon nitride, a silicon oxide, or the like used to form an inorganic insulating layer.

The passivation layer 180 prevents a pigment of a color filter from being introduced into the exposed semiconductor layers 154a, 154b, and 154c if it may be disposed below the color filter.

The color filter 230 is disposed on the passivation layer 180 and may uniquely display one of primary colors, and the primary colors may be, for example, three primary colors such as red, green, and blue, or yellow, cyan, magenta, and the like.

Though not illustrated, a color filter for displaying mixed colors of the primary colors, or white may be additionally included.

A first contact hole 185a and a second contact hole 185b are disposed in the passivation layer 180 and the color filter 230 to expose the first and second drain electrodes 175a and 175b.

A pixel electrode 191 may be disposed on a color filter 230.

The pixel electrode 191 includes the first subpixel electrode 191a and the second subpixel electrode 191b that are separately divided while interposing the gate line 121 therebetween to neighbor each other in the column direction.

The pixel electrode 191 may be formed of a transparent material such as ITO, IZO, etc.

The pixel electrode 191 may be formed of a transparent conductive material such as ITO or IZO, or a reflective metal such as aluminum, silver, chromium, or an alloy thereof.

On the color filter 230, a shielding electrode 199 formed of the same material as the pixel electrode 191 may be disposed in the same layer as the pixel electrode 191.

The pixel electrode 191 and the shielding electrode 199 may be simultaneously formed using the same process.

The pixel electrode 191 and the shielding electrode 199 according to the present invention will be described with reference to FIG. 5.

First, as described above, the pixel electrode 191 includes the first and second subpixel electrodes 191a and 191b.

In this case, one pixel area refers to an area that overlaps one of the first subpixel electrodes 191a and one of the second subpixel electrodes 191b and in which liquid crystal molecules 31 are aligned in a predetermined direction.

The first subpixel electrode 191a includes a first horizontal stem portion 193a that extends in the column direction, the first vertical stem portion 194a that extends from one end of the first horizontal stem portion 193a in the row direction, and the plurality of first micro branch portions 197a that extend from opposite sides of the first horizontal stem portion 193a in diagonal directions.

According to the exemplary embodiment of the present invention, the first subpixel electrode 191a includes one first horizontal stem portion 193a, and the first subpixel electrode 191a includes two regions in which alignment directions of the liquid crystal molecules 31 are different based on the first horizontal stem portion 193a.

Referring to FIG. 5 as an example, the liquid crystal molecules 31 disposed in an upper region R1 of the first horizontal stem portion 193a are arranged in a lower right direction, while the liquid crystal molecules 31 disposed in a lower region R2 of the first horizontal stem portion 193a are arranged in an upper right direction.

In the first subpixel electrode 191a included in one pixel area, the first horizontal stem portion 193a may be disposed at a right side and may be coupled to the first vertical stem portion 194a that is perpendicular to one end of the first horizontal stem portion 193a, and the first micro branch portions 197a extending from the first horizontal stem portion 193a obliquely extend in directions away from the first vertical stem portion 194a.

The first subpixel electrode 191a included in one pixel area includes the plurality of regions R1 and R2 that are divided by the first horizontal stem portion 193a and the first vertical stem portion 194a.

The first horizontal stem portion 193a and the first vertical stem portion 194a form a border between the neighboring regions R1 and R2.

The plurality of micro branch portions 197a disposed in each of the regions R1 and R2 may respectively extend in different directions.

Particularly, the micro branch portions 197a of the adjacent regions R1 and R2 may form an angle of about 90° or 180°.

In each of the regions R1 and R2, the extending direction of the micro branch portions 197a may be predetermined.

Specifically, among the regions R1 and R2 divided by the first horizontal stem portion 193a and the first vertical stem portion 194a, the first micro branch portions 197a of the upper region R1 may obliquely extend from the first horizontal stem portion 193a or the first vertical stem portion 194a in an upper left direction, and the first micro branch portions 197a of the lower region R2 may obliquely extend from the first horizontal stem portion 193a or the first vertical stem portion 194a in a lower left direction.

Minute slits in which the electrode is removed are disposed between the neighboring first micro branch portions 197a.

An acute angle formed between the first micro branch portions 197a and the first horizontal stem portion 193a may be about 40° to 45°, but it is not limited thereto, and may be appropriately adjusted in consideration of display characteristics such as visibility and the like of the LCD.

In FIG. 5 and the aforementioned description, the exemplary embodiment in which the first vertical stem portion 194a may be disposed at the right side of one pixel area is described, but it is not limited thereto, and the exemplary embodiment in which it may be disposed at a left side may also be possible.

The first micro branch portions 197a extending from the first horizontal stem portion 193a partially extend to form a wide region through which a voltage may be supplied from the first drain electrode 175a that may be exposed by the first contact hole 185a.

The second subpixel electrode 191b includes one second horizontal stem portion 193b that extends in the column direction, a second vertical stem portion 194b that may be disposed at one end of the second horizontal stem portion 193b to be perpendicular to the second horizontal stem portion 193b, and the plurality of second micro branch portions 197b that extend at opposite sides of the second horizontal stem portion 193b in diagonal directions.

The second horizontal stem portion 193b may be disposed at the left side, and may be coupled to the second vertical stem portion 194b that is perpendicular to one end of the second horizontal stem portion 193b.

The second micro branch portions 197b extending from the second horizontal stem portion 193b obliquely extend in directions away from the second vertical stem portion 194b.

Accordingly, according to the exemplary embodiment illustrated in FIG. 5, when the second vertical stem portion 194b is coupled to the second horizontal stem portion 193b such that it may be disposed at the left side of one pixel area, the second micro branch portions 197b extend rightward.

On the contrary, when the second vertical stem portion 194b may be coupled to the second horizontal stem portion 193b such that it may be disposed at the right side, the micro branch portions 197b may extend leftward.

The second subpixel electrode 191b includes a plurality of regions R3 and R4 that are divided by the second horizontal stem portion 193b, the second vertical stem portion 194b, and a gap.

That, the second horizontal stem portion 193b, the second vertical stem portion 194b, and the gap form a border between the neighboring regions R3 and R4.

A plurality of second micro branch portions 197b disposed in each of the regions R3 and R4 may obliquely extend outwardly from the second horizontal stem portion 193b or the second vertical stem portion 194b.

The second micro branch portions 197b of the different regions R3 and R4 included in the second subpixel electrode 191b may extend in different directions.

Particularly, the micro branch portions 197b of the adjacent regions R3 and R4 may form an angle of about 90° or 180°.

In each of the regions R3 and R4, the extending direction of the micro branch portions 197b may be predetermined.

Specifically, among the regions R3 and R4 divided by the second horizontal stem portion 193b and the second vertical stem portion 194b, the second micro branch portions 197b of the upper region R3 may obliquely extend from the second horizontal stem portion 193b in the upper right direction, and the second micro branch portions 197b of the lower region R4 may obliquely extend from the second horizontal stem portion 193b in the lower right direction.

Correspondingly, the liquid crystal molecules 31 of the upper region R3 are arranged in the lower left direction, while the liquid crystal molecules 31 of the lower region R4 are arranged in the upper left direction.

That is, based on the second horizontal stem portion 193b, two regions may be present where the alignments of the liquid crystal molecules 31 are respectively different.

An acute angle formed between the second micro branch portions 197b and the second horizontal stem portion 193b may be about 40° to 45°, but it is not limited thereto, and may be appropriately adjusted in consideration of display characteristics such as visibility and the like of the liquid crystal display.

The second micro branch portions 197b extending from the second horizontal stem portion 193b may partially extend to form a wide region through which a voltage may be supplied from the second drain electrode 175b that may be exposed by the second contact hole 185b.

When the first vertical stem portion 194a may be disposed at the right side of one pixel area, the second vertical stem portion 194b may be disposed at the left side thereof.

That is, the first and second vertical stem portions 194a and 194b included in one pixel area may be alternately disposed with respect to each other.

In addition, an area ratio of the first micro branch portions 197a extending from the first horizontal stem portion 193a to the second micro branch portions 197b extending from the second horizontal stem portion 193b may be about 1:1.

When having the area ratio as such, a region to be divided into four may be formed depending on alignment directions of the liquid crystal molecules 31.

Specifically, the liquid crystal molecules 31 disposed in the upper region R1 of the first horizontal stem portion 193a are arranged in the lower right direction, the liquid crystal molecules 31 disposed in the lower region R2 of the first horizontal stem portion 193a are arranged in the upper right direction, the liquid crystal molecules 31 disposed in the upper region R3 of the second horizontal stem portion 193b are arranged in the lower left direction, and the liquid crystal molecules 31 disposed in the lower region R4 of the second horizontal stem portion 193b are arranged in the upper left direction.

Accordingly, the entire region from the first and second horizontal stem portions 193a and 193b may include four regions in which the alignment directions of the liquid crystal molecules 31 are respectively different.

In addition, the second subpixel electrode 191b further includes a cross-shaped stem portion 192 and a plurality of third micro branch portions 197c extending therefrom in the diagonal directions.

The cross-shaped stem portion 192 includes a third horizontal stem portion 193c and the third vertical stem portion 194c perpendicular thereto.

The second subpixel electrode 191b may be coupled to the second micro branch portions 197b through the cross-shaped stem portion 192 or the third micro branch portions 197c.

The cross-shaped stem portion 192 of the second subpixel electrode 191b and the micro branch portions 197c extending therefrom have a substantially quadrangular shape.

In addition, the electrode including the cross-shaped stem portion 192 is divided into four regions Da, Db, Dc, and Dd by the third horizontal stem portion 193c and the third vertical stem portion 194c, and the four regions respectively include a plurality of third micro branch portions 197c.

The third micro branch portions 197c disposed in the first region Da obliquely extend from the third horizontal stem portion 193c or the third vertical stem portion 194c in the upper left direction, and the third micro branch portions 197c disposed in the second region Db obliquely extend from the third horizontal stem portion 193c or the third vertical stem portion 194c in the lower left direction.

The third micro branch portions 197c disposed in the third region Dc extend from the third horizontal stem portion 193c or the third vertical stem portion 194c in the upper right direction, and the third micro branch portions 197c of the fourth region Dd obliquely extend from the third horizontal stem portion 193c or the third vertical stem portion 194c in the lower right direction.

The four regions Da, Db, Dc, and Dd divided by the cross-shaped stem portion 192 respectively correspond to the four regions R1, R2, R3, and R4 that are formed based on the first horizontal stem portion 193a and the second horizontal stem portion 193b.

That is, each of the micro branch portions extending from the regions has each of the same extending directions such that the alignment directions of the liquid crystal molecules are also identical.

The third micro branch portions 197c form an angle of 45° or 135° with respect to the gate line 121 or the third horizontal stem portion 193c.

In addition, the third micro branch portions 197c of two neighboring regions of Da, Db, Dc, and Dd may be perpendicular to each other.

In this case, sides of the third micro branch portions 197c distort an electric field to generate a horizontal component for determining tilt directions of the liquid crystal molecules 31.

The horizontal component of the electric field is nearly parallel to the sides of the third micro branch portions 197c.

Thus, as shown in FIG. 5, the liquid crystal molecules 31 are tilted in directions parallel to length directions of the micro branch portions 197c.

Since one pixel electrode 191 includes the four different regions Da to Dd in which the length directions of micro branch portions 197c are respectively different, the tilt directions of the liquid crystal molecules 31 are substantially four directions, and the four different domains having the different alignment directions of the liquid crystal molecules 31 are formed in a liquid crystal layer 3.

As such, when the tilt directions of the liquid crystal molecules are variously set, a reference viewing angle of the LCD becomes wider.

Referring to FIG. 5, the second horizontal stem portion 193b of the second subpixel electrode 191b may be disposed adjacent to the first subpixel electrode 191a, and the cross-shaped stem portion 192 may be disposed downward of the second horizontal stem portion 193b.

However, without being limited to these positions, the cross-shaped stem portion 192 may also be disposed adjacent to the first subpixel electrode 191a.

This will be described later with reference to FIG. 6.

The first and second subpixel electrodes 191a and 191b are respectively coupled to the first drain electrode 175a or the second drain electrode 175b through the first and second contact holes 185a and 185b, and are respectively applied with the data voltage from the first and second drain electrodes 175a and 175b.

The shielding electrode 199 may be disposed at an edge of one pixel to overlap the data line 171.

The shielding electrode 199 includes vertical portions 196 extending along the data line 171, and one or more horizontal portions 198 for interconnecting the neighboring vertical portions 196.

The horizontal portion 198 of the shielding electrode may include an expanded region in the middle.

The shielding electrode 199 may be applied with the same voltage as the common electrode (not shown).

Accordingly, since no electric field may be generated between the shielding electrode 199 and the common electrode, the liquid crystal molecules interposed therebetween are not arranged.

Accordingly, the liquid crystals between the shielding electrode 199 and a common electrode 270 are in a black state.

As such, when the liquid crystal molecules display black, the liquid crystal molecules themselves may serve as a light blocking member.

Accordingly, in the display device according to the exemplary embodiment of the present invention, the light blocking member that may be disposed on the second insulation substrate to extend in the row direction can be omitted.

An upper panel 200 will now be described.

A light blocking member 220 may be disposed on a second insulation substrate 210 that may be formed of transparent glass or plastic and faces the first insulation substrate 110.

The light blocking member 220 is referred to as a black matrix, and serves to prevent light leakage.

The light blocking member 220 according to the exemplary embodiment of the present invention may extend in the column direction along the gate line 121.

When the color filter is disposed in a lower panel 100, the color filter of the upper panel 200 may be omitted, but it is not limited thereto, and the color filter may be disposed on the second insulation substrate 210.

On the contrary, the light blocking member 220 disposed on the second insulation substrate 210 according to the exemplary embodiment of the present invention may also be disposed on the first insulation substrate 110.

An overcoat 250 may be disposed on the light blocking member 220.

The overcoat 250 may be formed of an (organic) insulating material, and prevents the light blocking member 220 from being exposed and provides a smooth surface.

The overcoat 250 may be omitted.

The common electrode 270 may be disposed on the overcoat 250.

The common electrode 270 may be formed of the same material as the pixel electrode 191, and may be formed to have a planar shape to be applied with the common voltage.

In addition, an alignment layer (not shown) may be disposed on the pixel electrode 191 and the common electrode 270.

The liquid crystal layer 3 may be disposed between the lower panel 100 and the upper panel 200.

The liquid crystal layer 3 has negative dielectric anisotropy, and the liquid crystal molecules 31 of the liquid crystal layer 3 are aligned such that their long axes are perpendicular to surfaces of the two display panels 100 and 200 when no electric field is present.

The first and second subpixel electrodes 191a and 191b to which the data voltage is applied generate an electric field along with the common electrode 270 of the upper panel 200, thereby determining the alignment directions of the liquid crystal molecules of the liquid crystal layer 3 interposed between the two electrodes 191 and 270.

Depending on the directions of the liquid crystal molecules determined as such, luminance of light passing through the liquid crystal layer 3 is controlled.

An LCD according to another exemplary embodiment of the present invention will now be described with reference to FIGS. 6 to 9.

Figure 6:
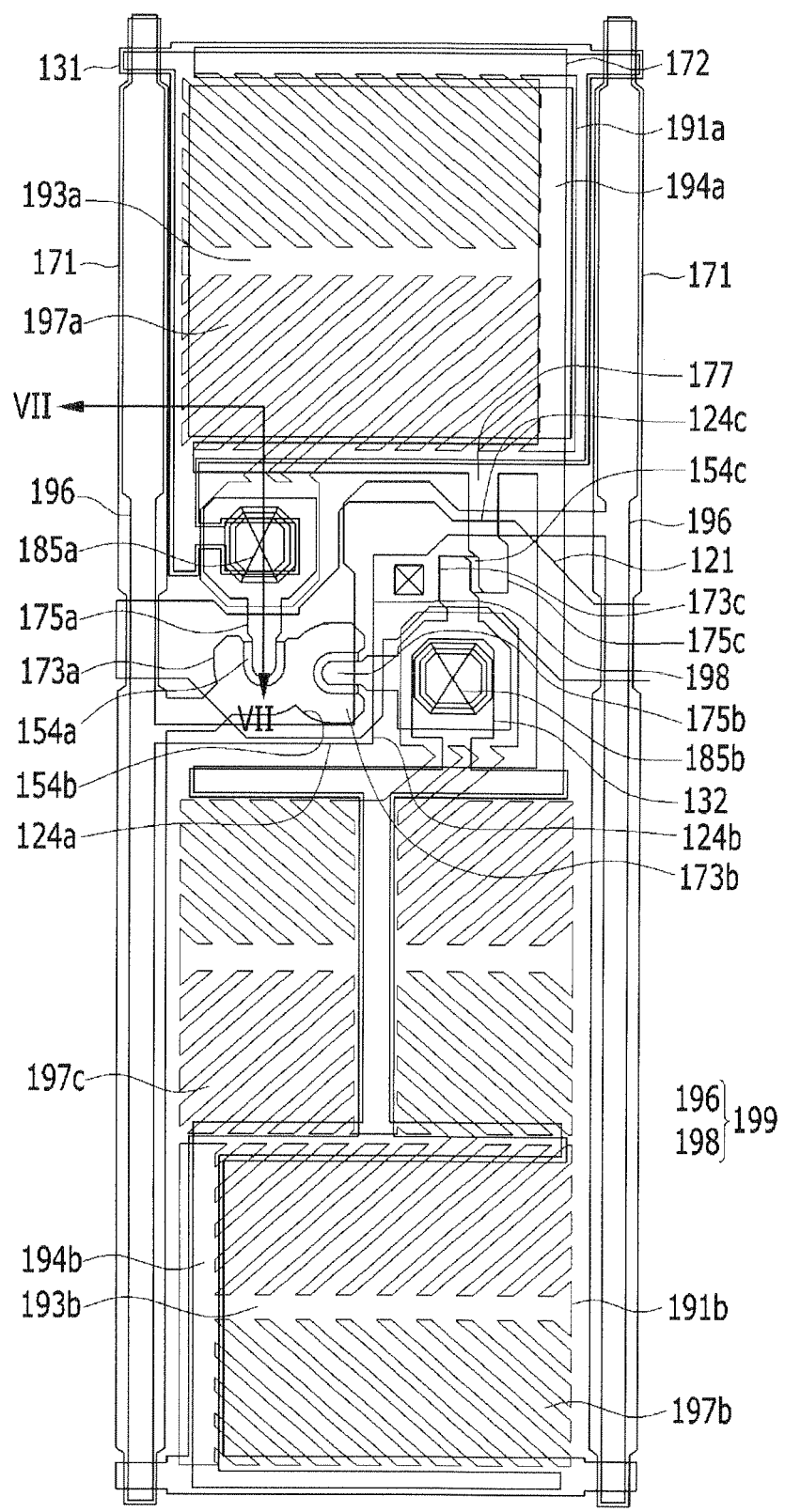
FIG. 6 is a top plan view of one pixel according to another exemplary embodiment of the present invention.
Figure 7:
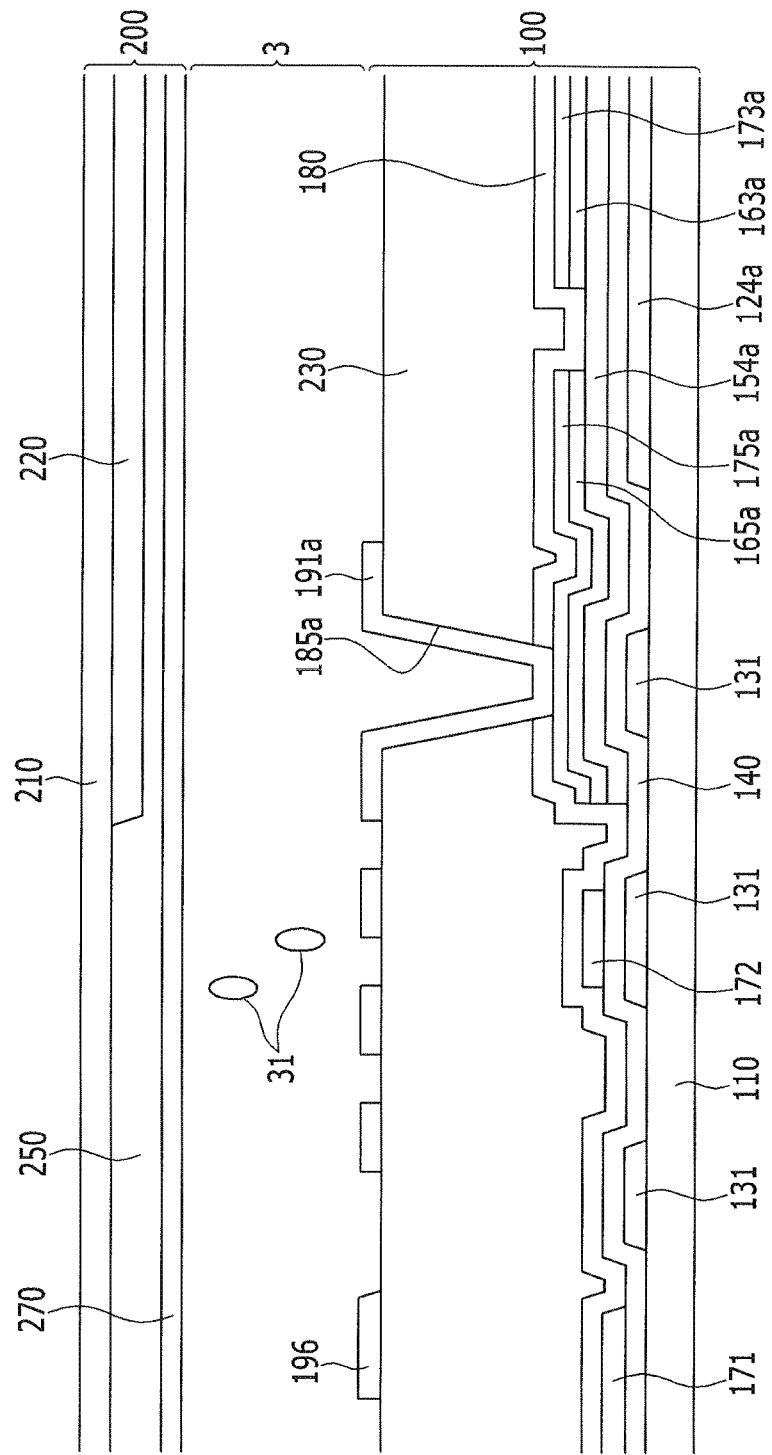
FIG. 7 is a cross-sectional view of FIG. 6 taken along the line VII-VII.
Figure 8:
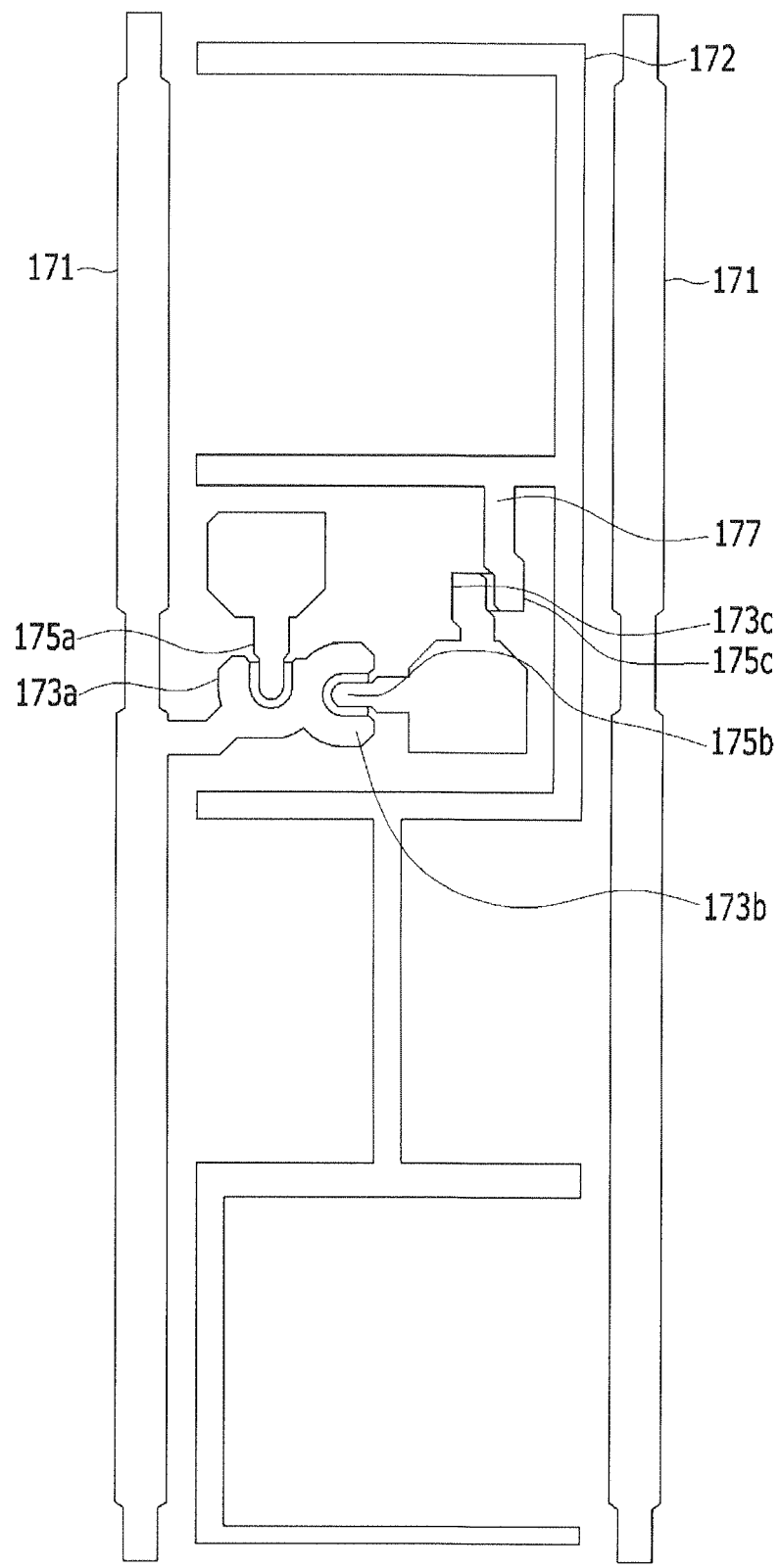
FIG. 8 is a top plan view of a data conductor layer according to another exemplary embodiment of the present invention.
Figure 9:
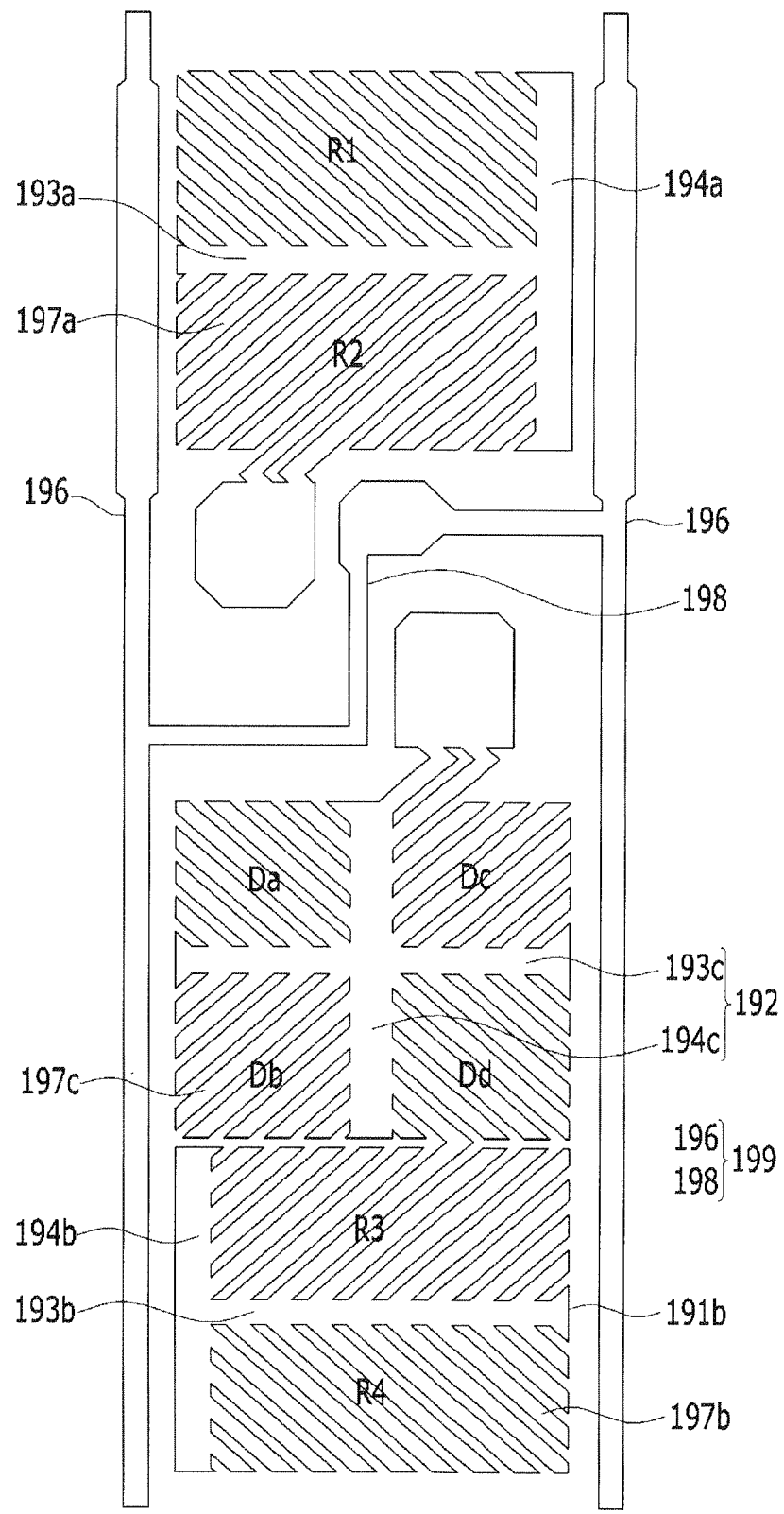
FIG. 9 is a top plan view of a pixel electrode layer according to another exemplary embodiment of the present invention.

FIG. 6 is a top plan view of one pixel according to another exemplary embodiment of the present invention, FIG. 7 is a cross-sectional view of FIG. 6 taken along the line VII-VII, FIG. 8 is a top plan view of a data conductor layer according to another exemplary embodiment of the present invention, and FIG. 9 is a top plan view of a pixel electrode layer according to another exemplary embodiment of the present invention.

In the following, only a shape of a pixel electrode according to another exemplary embodiment of the present invention will be described, and a description of the omitted constituent elements is identical to or similar to the exemplary embodiment of the present invention described in FIGS. 2 to 4.

First, as described above, a pixel electrode 191 includes a first subpixel electrode 191a and a second subpixel electrode 191b.

One pixel area refers to a region where one pixel electrode 191 overlaps liquid crystal molecules 31.

The first subpixel electrode 191a includes a first horizontal stem portion 193a that extends in a column direction, a first vertical stem portion 194a that extends from one end of the first horizontal stem portion 193a in a row direction, and a plurality of first micro branch portions 197a that extend from opposite ends of the first horizontal stem portion 193a in diagonal directions.

According to the exemplary embodiment of the present invention, the first subpixel electrode 191a includes one first horizontal stem portion 193a, and includes two regions in which alignment directions of the liquid crystal molecules 31 are respectively different based on the first horizontal stem portion 193a.

Referring to FIG. 9 as an example, the liquid crystal molecules 31 disposed in an upper region R1 of the first horizontal stem portion 193a are arranged in a lower right direction, while the liquid crystal molecules 31 disposed in a lower region R2 of the first horizontal stem portion 193a are arranged in an upper right direction.

In the first subpixel electrode 191a included in one pixel area, the first horizontal stem portion 193a may be disposed at a right side and may be coupled to the first vertical stem portion 194a that is perpendicular to one end of the first horizontal stem portion 193a, and the first micro branch portions 197a extending from the first horizontal stem portion 193a obliquely extend in directions away from the first vertical stem portion 194a.

Meanwhile, as described above, the first subpixel electrode 191a includes a plurality of regions R1 and R2 in which the alignment directions of the liquid crystal molecules 31 are different based on the first horizontal stem portion 193a and the first vertical stem portion 194a.

That is, the first horizontal stem portion 193a and the first vertical stem portion 194a form a border between the neighboring regions R1 and R2.

The plurality of micro branch portions 197a disposed in each of the regions R1 and R2 may respectively extend in different directions.

Particularly, the micro branch portions 197a of the adjacent regions R1 and R2 may form an angle of about 90° or 180°.

In each of the regions R1 and R2, the extending direction of the micro branch portions 197a may be predetermined.

Specifically, among the regions R1 and R2 divided by the first horizontal stem portion 193a and the first vertical stem portion 194a, the first micro branch portions 197a of the upper region R1 may obliquely extend from the first horizontal stem portion 193a or the first vertical stem portion 194a in an upper left direction, and the first micro branch portions 197a of the lower region R2 may obliquely extend from the first horizontal stem portion 193a or the first vertical stem portion 194a in a lower left direction.

Meanwhile, minute slits in which the electrode is removed are disposed between the neighboring first micro branch portions 197a.

An acute angle formed between the first micro branch portions 197a and the first horizontal stem portion 193a may be about 40° to 45°, but it is not limited thereto, and may be appropriately adjusted in consideration of display characteristics such as visibility and the like of the LCD.

In FIG. 6 and the aforementioned description, the exemplary embodiment in which the first vertical stem portion 194a may be disposed at the right side of one pixel area is described, but it is not limited thereto, and the exemplary embodiment in which it may be disposed at a left side may also be possible.

The first micro branch portions 197a extending from the first horizontal stem portion 193a partially extend to form a wide region through which a voltage may be supplied from the first drain electrode 175a that may be exposed by the first contact hole 185a.

The second subpixel electrode 191b further includes a cross-shaped stem portion 192 and a plurality of third micro branch portions 197c extending therefrom in the diagonal directions.

The cross-shaped stem portion 192 includes a third horizontal stem portion 193c and a third vertical stem portion 194c perpendicular thereto.

The cross-shaped stem portion 192 of the second subpixel electrode 191b and the micro branch portions 197c extending therefrom have a substantially quadrangular shape.

In addition, the electrode including the cross-shaped stem portion 192 is divided into four regions Da, Db, Dc, and Dd by the third horizontal stem portion 193c and the third vertical stem portion 194c, and the four regions respectively include a plurality of third micro branch portions 197c.

The third micro branch portions 197c disposed in the first region Da obliquely extend from the third horizontal stem portion 193c or the third vertical stem portion 194c in the upper left direction, and the third micro branch portions 197c disposed in the second region Db obliquely extend from the third horizontal stem portion 193c or the third vertical stem portion 194c in the lower left direction.

The third micro branch portions 197c disposed in the third region Dc extend from the third horizontal stem portion 193c or the third vertical stem portion 194c in the upper right direction, and the third micro branch portions 197c of the fourth region Dd obliquely extend from the third horizontal stem portion 193c or the third vertical stem portion 194c in the lower right direction.

The four regions Da, Db, Dc, and Dd divided by the cross-shaped stem portion 192 respectively correspond to the four regions R1, R2, R3, and R4 that are formed based on the first horizontal stem portion 193a and the second horizontal stem portion 193b to be described later.

That is, each of the micro branch portions extending from the regions has each of the same extending directions such that the alignment directions of the liquid crystal molecules are also identical.

The third micro branch portions 197c form an angle of 45° or 135° with respect to the gate lines 121a and 121b or the third horizontal stem portion 193c.

In addition, the third micro branch portions 197c of two neighboring regions of Da, Db, Dc, and Dd may be perpendicular to each other.

In this case, sides of the third micro branch portions 197c distort an electric field to generate a horizontal component for determining tilt directions of the liquid crystal molecules 31.

The horizontal component of the electric field is nearly parallel to the sides of the third micro branch portions 197c.

Thus, as shown in FIG. 9, the liquid crystal molecules 31 are tilted in directions parallel to length directions of the micro branch portions 197c.

Since one pixel electrode 191 includes the four different regions Da to Dd in which the length directions of micro branch portions 197c are respectively different, the tilt directions of the liquid crystal molecules 31 are substantially four directions, and the four different domains having the different alignment directions of the liquid crystal molecules 31 are formed in a liquid crystal layer 3.

As such, when the tilt directions of the liquid crystal molecules are variously set, a reference viewing angle of the LCD becomes wider.

The third micro branch portions 197c may partially extend to form a wide region through which a voltage may be supplied from the second drain electrode 175b that may be exposed by the second contact hole 185b.

That is, referring to FIG. 9, the second subpixel electrode 191b of one pixel area may include a cross-shaped stem portion 192 that may be disposed adjacent to the first subpixel electrode 191a, and a second horizontal stem portion 193b disposed downward of the cross-shaped stem portion 192.

The second subpixel electrode 191b includes one second horizontal stem portion 193b that extends in the column direction, a second vertical stem portion 194b that may be disposed at one end of the second horizontal stem portion 193b to be perpendicular to the second horizontal stem portion 193b, and a plurality of micro branch portions 197b that extend at opposite sides of the second horizontal stem portion 193b in diagonal directions.

The second horizontal stem portion 193b may be disposed at a left side of one pixel area, and may be coupled to the second vertical stem portion 194b that may be disposed to be perpendicular to one end of the second horizontal stem portion 193b.

The second micro branch portions 197b extending from the second horizontal stem portion 193b obliquely extend in directions away from the second vertical stem portion 194b.

Accordingly, according to the exemplary embodiment illustrated in FIG. 9, when the second vertical stem portion 194b may be coupled to the second horizontal stem portion 193b such that it may be disposed at the left side of one pixel area, the second micro branch portions 197b extend rightward.

On the contrary, when the second vertical stem portion 194b may be coupled to the second horizontal stem portion 193b such that it may be disposed at a right side of one pixel area, the micro branch portions 197b may extend leftward.

The second subpixel electrode 191b includes a plurality of regions R3 and R4 that are divided by the second horizontal stem portion 193b, the second vertical stem portion 194b, and a gap.

That, the second horizontal stem portion 193b, the second vertical stem portion 194b, and the gap form a border between the neighboring regions R3 and R4.

A plurality of second micro branch portions 197b disposed in each of the regions R3 and R4 may obliquely extend outwardly from the second horizontal stem portion 193b or the second vertical stem portion 194b.

Further, the second micro branch portions 197b of the different regions R3 and R4 included in the second subpixel electrode 191b may extend in different directions.

Particularly, the micro branch portions 197b of the adjacent regions R3 and R4 may form an angle of about 90° or 180°.

In each of the regions R3 and R4, the extending direction of the micro branch portions 197b may be predetermined.

Specifically, among the regions R3 and R4 divided by the second horizontal stem portion 193b and the second vertical stem portion 194b, the second micro branch portions 197b of the upper region R3 may obliquely extend from the second horizontal stem portion 193b in the upper right direction, and the micro branch portions 197b of the lower region R4 may obliquely extend from the second horizontal stem portion 193b in the lower right direction.

Correspondingly, the liquid crystal molecules 31 of the upper region R3 are arranged in the lower left direction, while the liquid crystal molecules 31 of the lower region R4 are arranged in the upper left direction.

That is, there may be two regions in which the arrangements of the liquid crystal molecules 31 are respectively different based on the second horizontal stem portion 193b.

An acute angle formed between the second micro branch portions and 197b and the second horizontal stem portion 193b may be about 40° to 45°, but it is not limited thereto, and may be appropriately adjusted in consideration of display characteristics such as visibility and the like of the liquid crystal display.

When the first vertical stem portion 194a may be disposed at the right side of one pixel area, the second vertical stem portion 194b may be disposed to the left side thereof.

That, the first and second vertical stem portions 194a and 194b included in one pixel area may be alternately disposed with respect to each other.

In addition, an area ratio of the first micro branch portions 197a extending from the first horizontal stem portion 193a to the second micro branch portions 197b extending from the second horizontal stem portion 193b may be about 1:1.

When having the ratio as such, a region to be divided by four regions can be formed depending on the arrangements of the liquid crystal molecules 31.

Specifically, the liquid crystal molecules 31 disposed in the upper region R1 of the first horizontal stem portion 193a are arranged in the lower right direction, the liquid crystal molecules 31 disposed in the lower region R2 of the first horizontal stem portion 193a are arranged in the upper right direction, the liquid crystal molecules 31 disposed in the upper region R3 of the second horizontal stem portion 193b are arranged in the lower left direction, and the liquid crystal molecules 31 disposed in the lower region R4 of the second horizontal stem portion 193b are arranged in the upper left direction.

That is, the region from the first and second horizontal stem portions 193a and 193b may include four regions in which the alignment directions of liquid crystal molecules 31 are respectively different.

The first and second subpixel electrodes 191a and 191b are respectively coupled to the first drain electrode 175a or the second drain electrode 175b through the first and second contact holes 185a and 185b, and are respectively applied with the data voltage from the first and second drain electrodes 175a and 175b.

Another exemplary embodiment of the present invention will now be described with reference to FIGS. 10 and 11.

Figure 10:
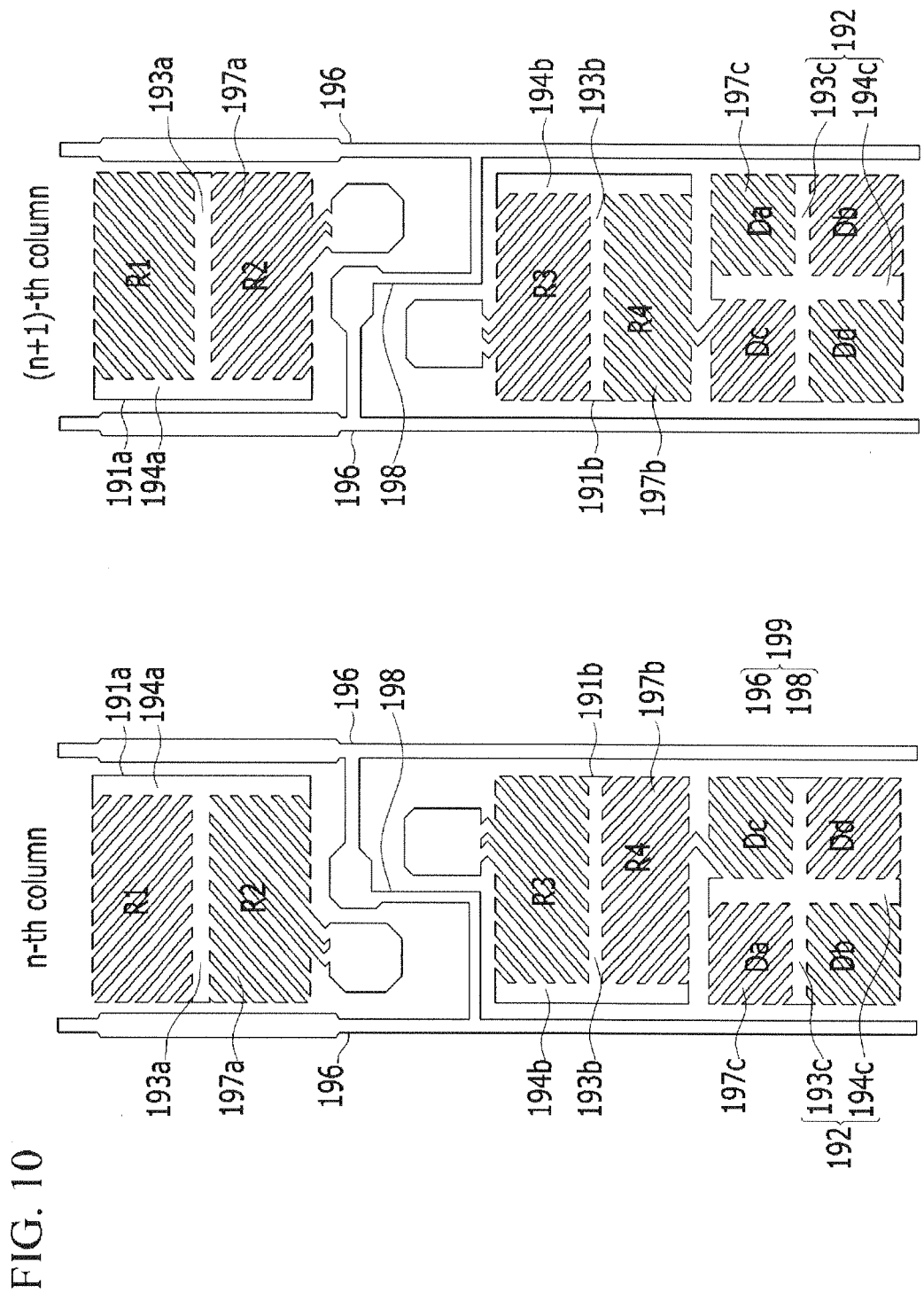
FIGS. 10 and 11 are top plan views illustrating arrangement of a plurality of pixels according to a further exemplary embodiment of the present invention.
Figure 11:
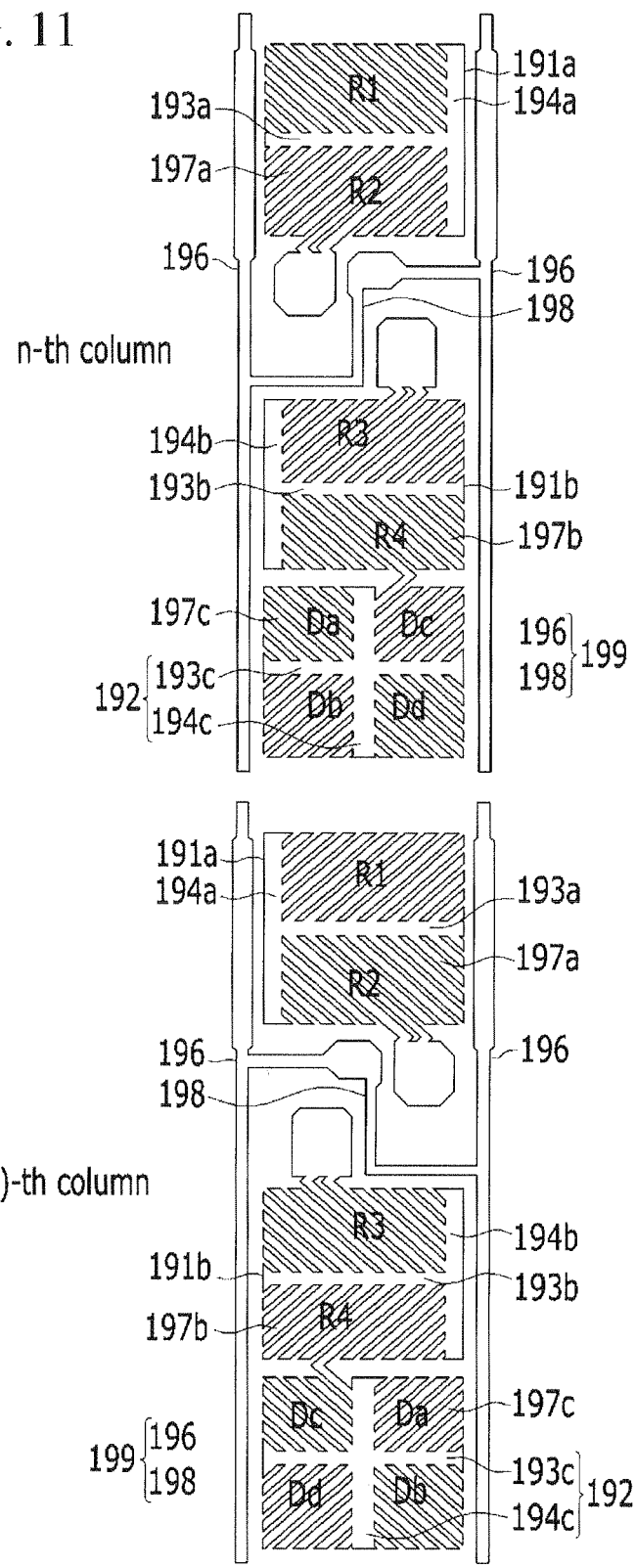

FIGS. 10 and 11 are top plan views illustrating arrangement of a plurality of pixels according to another exemplary embodiment of the present invention.

In the following, only arrangement of a plurality of pixel electrodes will be described, and the omitted constituent elements are identical to or similar to the aforementioned constituent elements.

First, as shown in FIG. 10, a plurality of first vertical stem portions 194a adjacent to each other in a column direction may be respectively alternately disposed.

As an example, the first vertical stem portion 194a disposed in an n-th column is disposed at a right side of one pixel area, and the first vertical stem portion 194a disposed in a (n+1)-th column may be disposed to a left thereof.

In this case, the second vertical stem portion 194b disposed in the n-th column may be disposed to the left side, and the second vertical stem portion 194b disposed in the (n+1)-th column may be disposed to the right side.

That is, according to the current exemplary embodiment of the present invention, the pixel electrode disposed in the n-th column and the pixel electrode disposed in the (n+1)-th column may be symmetric to each other based on a data line that may be disposed between both of the pixel electrodes.

According to the arrangement of the pixel electrodes described above, since alignment directions of liquid crystal molecules are variously obtained, visibility may be improved compared with an arrangement in which the pixel electrodes of the same shape are disposed in a matrix direction.

According to a further exemplary embodiment of the present invention, as shown in FIG. 11, a plurality of first vertical stem portions 194a adjacent to each other in a row direction may be respectively alternately disposed.

As an example, the first vertical stem portion 194a disposed in an n-th row may be disposed at the right side of one pixel area, and the first vertical stem portion 194a disposed in a (n+1)-th row may be disposed to the left side.

In this case, the second vertical stem portion 194b disposed in the n-th row may be disposed to the left side, and the second vertical stem portion 194b disposed in the (n+1)-th row may be disposed to the right side.

According to the exemplary embodiment illustrated in FIG. 11, the pixel electrode disposed in the n-th row and the pixel electrode disposed in the (n+1)-th row may be symmetric to each other based on a gate line that may be disposed between the opposite pixel electrodes.

According to the arrangement of the pixel electrodes, since the alignment directions of the liquid crystal molecules are variously obtained compared with the arrangement in which the pixel electrodes of the same shape are disposed in the matrix direction, the visibility of a display device can be improved.

In the present specification, only the arrangements in which the pixel electrodes are arranged in the row or column directions are described, but the present invention is not limited thereto and various combinations of the aforementioned exemplary embodiments may also be possible.

A circuit diagram of the display device according to the exemplary embodiment of the present invention will now be described with reference to FIGS. 12 to 15.

FIGS. 12 to 15 are circuit diagrams of one pixel according to a further exemplary embodiment of the present invention.

Shapes of the gate line and data line illustrated in FIGS. 2 to 4 can be modified as shown in FIGS. 12 to 15, which represent that pixel arrangements of FIG. 12 to FIG. 15 having the aforementioned shapes of the pixel electrodes may be possible.

Figure 12:
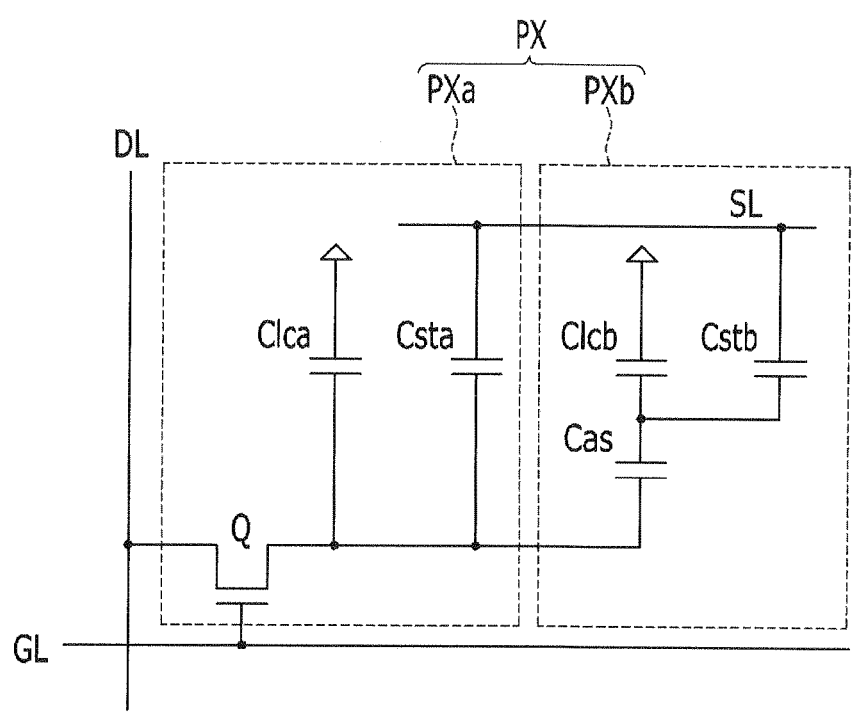
FIGS. 12 to 15 are circuit diagrams of one pixel according to further exemplary embodiments of the present invention.

An exemplary embodiment of FIG. 12 will now be described.

A liquid crystal display according to the exemplary embodiment of the present invention includes: signal line including a plurality of gate lines GL, a plurality of data lines DL, and a plurality of storage electrode lines SL; and a plurality of pixels PX coupled thereto.

Each pixel PX includes a pair of first and second subpixels PXa and PXb, a first subpixel electrode may be formed in the first subpixel PXa, and a second subpixel electrode may be formed in the second subpixel PXb.

The liquid crystal display according to the exemplary embodiment of the present invention further includes: a switching element Q coupled to the gate line GL and the data line DL; a first storage capacitor Csta and a first liquid crystal capacitor Clca that are coupled to the switching element Q to be formed in the first subpixel PXa; a second liquid crystal capacitor Clcb and a second storage capacitor Cstb that are coupled to the switching element Q to be formed in the second subpixel PXb; and an auxiliary capacitor Cas that may be formed between the switching element Q and the second liquid crystal capacitor Clcb.

The switching element Q is a three-terminal element such as a thin film transistor or the like that may be provided in the lower panel 100, a control terminal thereof may be coupled to the gate line GL, an input terminal thereof may be coupled to the data line DL, and an output terminal thereof may be coupled to the first liquid crystal capacitor Clca, the first storage capacitor Csta, the auxiliary capacitor Cas.

One terminal of the auxiliary capacitor Cas may be coupled to the output terminal of the switching element Q, and the other terminal thereof may be coupled to the second liquid crystal capacitor Clcb and the second storage capacitor Cstb.

A charged voltage of the second liquid crystal capacitor Clcb can be decreased such that it is lower than the charged voltage of the first liquid crystal capacitor Clca, thereby improving side visibility of a liquid crystal display.

Figure 13:
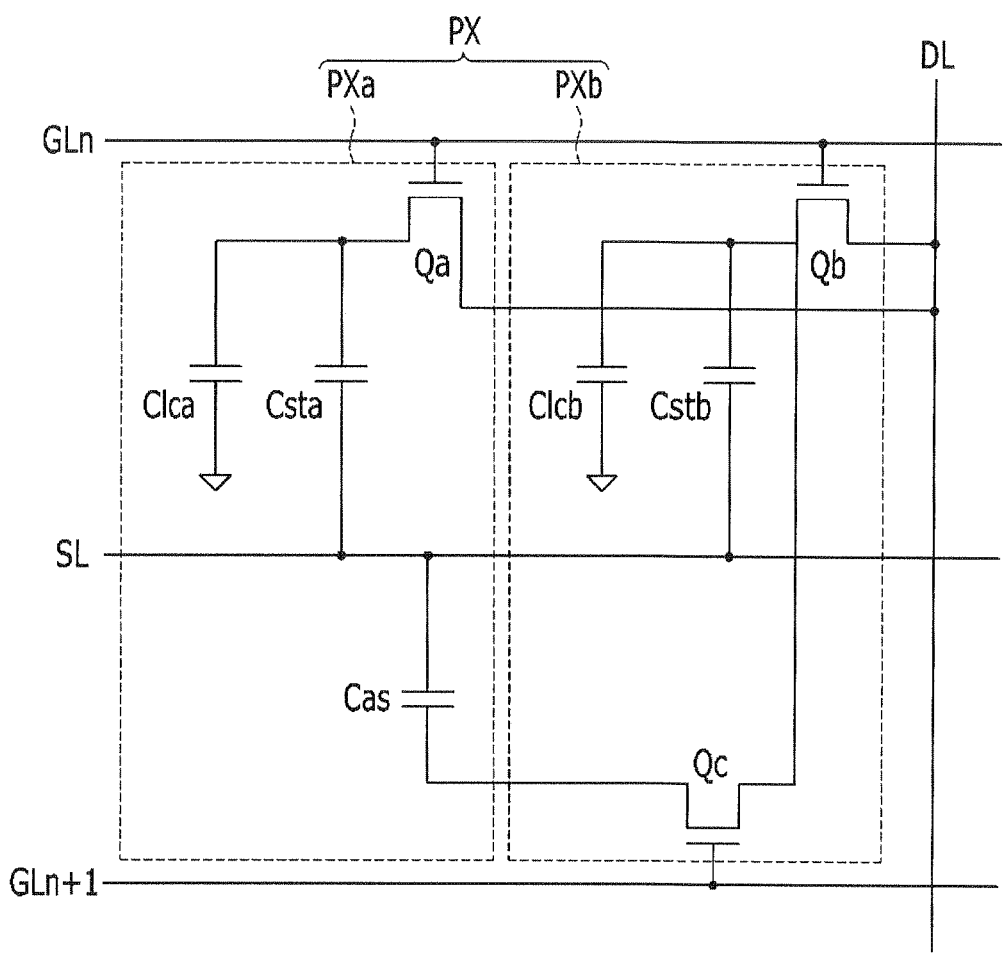

An exemplary embodiment of FIG. 13 will now be described.

A liquid crystal display according to the exemplary embodiment of the present invention includes: signal lines including a plurality of gate lines GLn, and GL(n+1), a plurality of data lines DL, a plurality of storage electrode lines SL; and a plurality of pixels PX coupled thereto.

Each pixel PX includes a pair of first and second subpixels PXa and PXb, a first subpixel electrode is formed in the first subpixel PXa, and a second subpixel electrode may be formed in the second subpixel PXb.

The liquid crystal display according to the exemplary embodiment of the present invention includes: a first switching element Qa and a second switching element Qb that are coupled to the gate line GLn and the data line DL; a first liquid crystal capacitor Clca and a first storage capacitor Csta that are coupled to the first switching element Qa to be formed in the first subpixel PX; a second liquid crystal capacitor Clcb and a second storage capacitor Cstb that are coupled to the second switching element Qb to be formed in the second subpixel; a third switching element Qc that may be coupled to the second switching element Qb to be switched by the next gate line GL(n+1); and an auxiliary capacitor Cas that may be coupled to the third switching element Qc.

The first and second switching elements Qa and Qb are three-terminal elements such as a thin film transistor or the like that are provided in a lower panel 100, control terminals thereof are coupled to the gate line GLn, input terminals thereof are coupled to the data line DL, output terminals thereof are respectively coupled to the first liquid crystal capacitor Clca and the first storage capacitor Csta as well as the second liquid crystal capacitor Clcb and the second storage capacitor Cstb.

The third switching element Qc is also a three-terminal element such as a thin film transistor or the like that may be provided in the lower panel 100, a control terminal thereof may be coupled to the next gate line GL(n+1), an input terminal thereof may be coupled to the second liquid crystal capacitor Clcb, and an output terminal thereof may be coupled to the auxiliary capacitor Cas.

One terminal of the auxiliary capacitor Cas may be coupled to the output terminal of the third switching element Qc, and the other terminal thereof may be coupled to the storage electrode line SL.

An operation of a liquid crystal display according to an exemplary embodiment of the present invention will be described. Once a gate-on voltage is applied to gate line GLn, a first switching element Qa and a second switching element Qb connected thereto are turned on, and a data voltage of the data line 171 is applied to first and second subpixel electrodes.

Next, when a gate-off voltage is applied to the gate line GLn and the gate-on voltage is then applied to a next gate line GL(n+1), the first and second switching elements Qa and Qb are turned off and a third switching element Qc is turned on.

Accordingly, charges of the second subpixel electrode coupled to an output terminal of the second switching element Qb is allowed to flow into an auxiliary capacitor Cas, thereby decreasing a voltage of the second liquid crystal capacitor Clcb.

Thus, the charged voltages of the first and second liquid crystal capacitors Clca and Clcb can be differently set to improve side visibility of the liquid crystal display.

Figure 14:
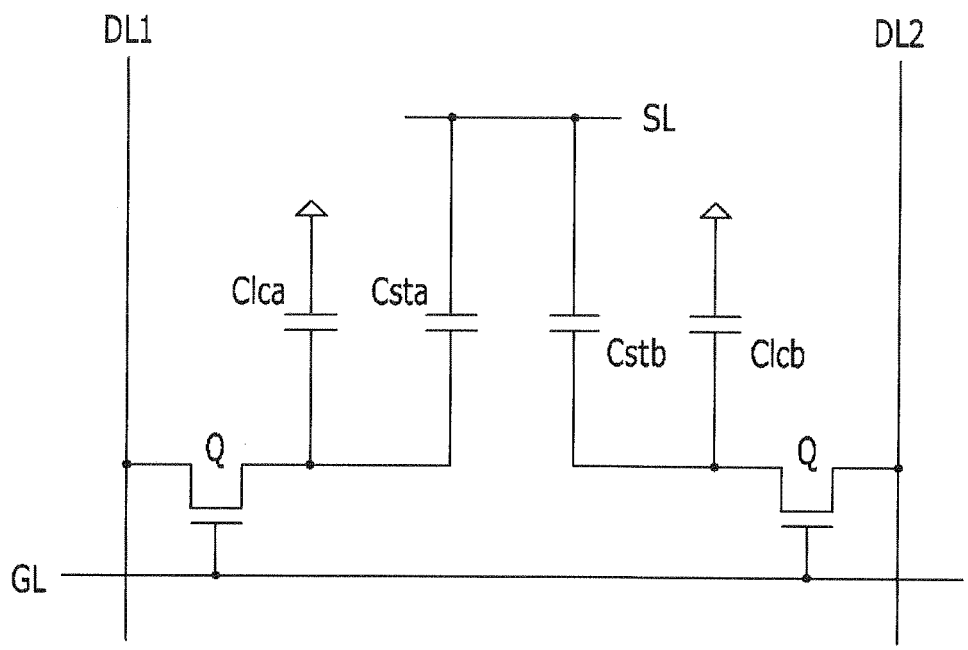

An exemplary embodiment of FIG. 14 will now be described.

A liquid crystal display according to the exemplary embodiment of the present invention includes: signal lines including a plurality of gate lines GL, a plurality of data lines DL1 and DL2, and a plurality of storage electrode lines SL; and a plurality of pixels PX coupled thereto.

Each pixel PX includes a pair of first and second liquid crystal capacitors Clca and Clab, and first and second storage capacitors Csta and Cstb.

Each subpixel includes one liquid crystal capacitor and one storage capacitor, and additionally includes one thin film transistor Q.

The thin film transistors Q of two subpixels included in one pixel are coupled to the same gate line GL but are respectively coupled to the different data lines DL1 and DL2.

Data voltages of different levels are simultaneously applied to the different data lines DL1 and DL2 to allow the first and second liquid crystal capacitors Clca and Clcb of the two subpixels to have different charged voltages.

Thus, side visibility of a liquid crystal display can be improved.

Figure 15:
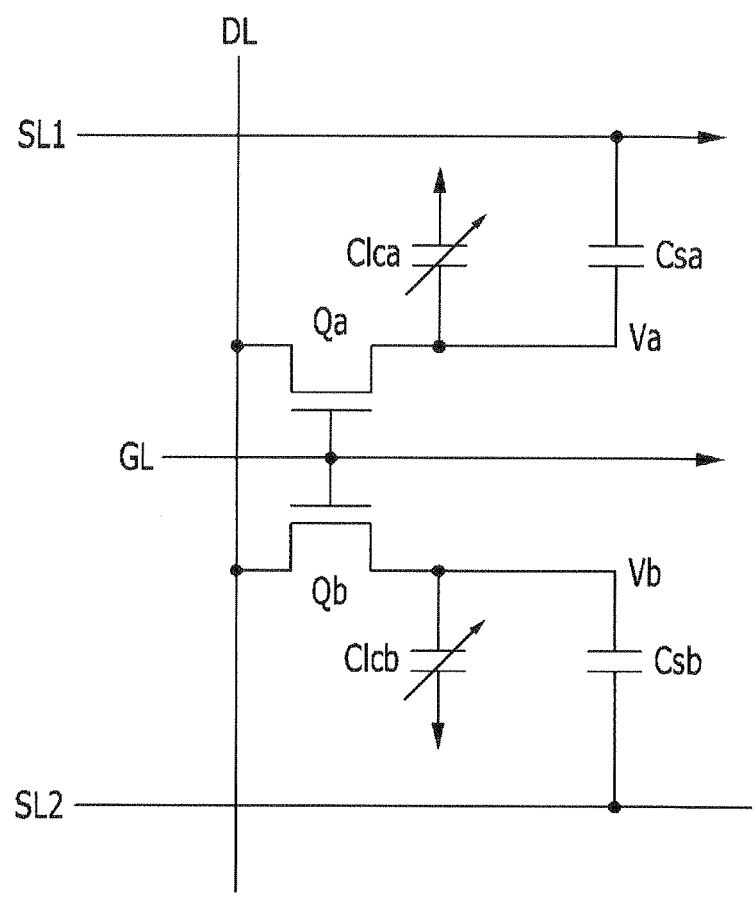

An exemplary embodiment of FIG. 15 will now be described.

As shown in FIG. 16, a liquid crystal display according to the exemplary embodiment of the present invention includes: a gate line GL; a data line DL; a first power line SL1; a second power line SL2; and a first switching element Qa and a second switching element Qb that are coupled to gate line GL and data line DL.

The liquid crystal display according to the exemplary embodiment of the present invention further includes an auxiliary step-up capacitor Csa and a first liquid crystal capacitor Clca that are coupled to the first switching element Qa, and an auxiliary step-down capacitor Csb and a second liquid crystal capacitor Clcb that are coupled to the second switching element Qb.

The first and second switching elements Qa and Qb are three-terminal elements such as a thin film transistor or the like.

The first and second switching elements Qa and Qb are coupled to the same gate line GL and the same data line DL and are turned on at the same timing so as to output the same data signal.

The first and second power lines SL1 and SL2 are applied with a voltage that can be swung for a predetermined period.

A first low voltage is applied to the first power line SL1 for the predetermined period (e.g., 1 H), and a first high voltage is applied thereto for the next predetermined period.

A second high voltage is applied to the second power line SL2 for the predetermined period, and a second low voltage is applied thereto for the next predetermined period.

In this case, the first period and the second period are repeated multiple times in one frame such that the voltage that can be swung is applied to the first and second power lines SL1 and SL2.

In this case, the first low voltage and the second low voltage may be the same, and the first high voltage and the second high voltage may also be the same.

The auxiliary step-up capacitor Csa may be coupled to the first switching element Qa and the first power line SL1, and the auxiliary step-down capacitor Csb may be coupled to the second switching element Qb and the second power line SL2.

A voltage Va of a terminal (hereinafter referred to as a "first terminal") of a part of the auxiliary step-up capacitor Csa coupled to the first switching element Qa is decreased when the first low voltage is applied to the first power line SL1, and is increased when the first high voltage is applied thereto.

Subsequently, as the voltage of the first power line SL1 is swung, the voltage Va of the first terminal is also swung.

In addition, a voltage Vb of a terminal (hereinafter referred to as a "second terminal") of a part of the auxiliary step-down capacitor Csb coupled to the second switching element Qb is increased when the second high voltage is applied to the second power line SL2, and is decreased if the second low voltage is applied thereto.

Subsequently, as the voltage of the second power line SL2 is swung, the voltage Vb of the second terminal is also swung.

As such, even if the same data voltage is applied to the two subpixels, the voltages Va and Vb of the pixel electrodes of the two subpixels are changed depending on the swung voltages of the first and second power line SL1 and SL2, thereby improving side visibility as well as differentiating transmittances of the two subpixels.

In the exemplary embodiments of FIGS. 12 to 15, a reference voltage line is not used, but any line parallel to the data line may be formed to traverse a center of a display area of a pixel, thereby improving a display quality.

According to the display device described above, the curved display device in which display abnormality due to the misalignment of the upper and lower substrates is reduced can be provided.

In addition, the display device of a high resolution having an advantage of easily controlling the generated texture even if a size of the pixel area is decreased can be provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a first insulation substrate;
a thin film transistor disposed on the first insulation substrate;
a pixel electrode coupled to the thin film transistor;
a second insulation substrate facing the first insulation substrate; and
a common electrode disposed on the second insulation substrate, wherein the pixel electrode includes: a first subpixel electrode that includes a first horizontal stem portion by which two regions where arrangements of liquid crystal molecules are respectively different from each other are divided from each other; and a second subpixel electrode that includes a second horizontal stem portion by which two regions where the arrangements of the liquid crystal molecules are respectively different from each other are divided from each other and a cross-shaped stem portion by which four regions where the arrangements of the liquid crystal molecules are respectively different from each other are divided from each other.

2. The display device of claim 1, wherein the display device is a curved type.

3. The display device of claim 1, wherein the first subpixel electrode and the second subpixel electrode further include a plurality of micro branch portions that diagonally extend from the first horizontal stem portion, the second horizontal stem portion, and the cross-shaped stem portion, and one pixel area is a region that overlaps the pixel electrode and in which the liquid crystal molecules are arranged.

4. The display device of claim 3, wherein the second horizontal stem portion of the one pixel area is disposed adjacent to the first horizontal stem portion.

5. The display device of claim 3, wherein the cross-shaped stem portion of the one pixel area is disposed adjacent to the first horizontal stem portion.

6. The display device of claim 1, wherein the first subpixel electrode further includes a first vertical stem portion that is disposed at one end of the first horizontal stem portion, the second subpixel electrode further includes a second vertical stem portion that is disposed at one end of the second horizontal stem portion, and the first and second vertical stem portions are alternately disposed.

7. The display device of claim 6, wherein four regions where the arrangements of the liquid crystal molecules are respectively different from each other are divided from each other by the first and second horizontal stem portions.

8. The display device of claim 3, wherein an area ratio of the micro branch portions extending from the first horizontal stem portion to the micro branch portions extending from the second horizontal stem portion is about 1:1.

9. The display device of claim 6, wherein the first vertical stem portions adjacent to each other in a column direction are alternately disposed.

10. The display device of claim 6, wherein the first vertical stem portions adjacent to each other in a row direction are alternately disposed.

11. The display device of claim 2, wherein the first and second subpixel electrodes further include a plurality of micro branch portions that diagonally extend from the first horizontal stem portion, the second horizontal stem portion, and the cross-shaped stem portion, and one pixel area is a region that overlaps the first and second subpixel electrodes and in which the liquid crystal molecules are arranged.

12. The display device of claim 11, wherein the second horizontal stem portion of the one pixel area is disposed adjacent to the first horizontal stem portion.

13. The display device of claim 11, wherein the cross-shaped stem portion of the one pixel area is disposed adjacent to the first horizontal stem portion.

14. The display device of claim 2, wherein the first subpixel electrode further includes a first vertical stem portion that is disposed at one end of the first horizontal stem portion, the second subpixel electrode further includes a second vertical stem portion that is disposed at one end of the second horizontal stem portion, and the first and second vertical stem portions are alternately disposed.

15. The display device of claim 14, wherein four regions where the arrangements of the liquid crystal molecules are respectively different from each other are divided from each other by the first and second horizontal stem portions.

16. The display device of claim 11, wherein an area ratio of the micro branch portions extending from the first horizontal stem portion to the micro branch portions extending from the second horizontal stem portion is about 1:1.

17. The display device of claim 14, wherein the first vertical stem portions adjacent to each other in a column direction are alternately disposed.

18. The display device of claim 14, wherein the first vertical stem portions adjacent to each other in a row direction are alternately disposed.

* * * * *